_US005940479A_

United States Patent [19]
Guy et al.

[11] Patent Number: 5,940,479
[45] Date of Patent: *Aug. 17, 1999

[54] SYSTEM AND METHOD FOR TRANSMITTING AURAL INFORMATION BETWEEN A COMPUTER AND TELEPHONE EQUIPMENT

[75] Inventors: Kenneth R. Guy, Thousand Oaks; Jaswant R. Jain, Chatsworth; Ishwar V. Jasuja, Simi Valley; Michael W. Johnson, Petaluma; Albert Juandy, Greenbrae; Simon S. Lam, Agoura Hills; Anthony Y. Lee, Northridge; David Misunas, Thousand Oaks; Jacques A. Roth, San Rafael, all of Calif.

[73] Assignee: Northern Telecom Limited, Montreal, Canada

[*] Notice: This patent is subject to a terminal disclaimer.

[21] Appl. No.: 08/724,655

[22] Filed: Oct. 1, 1996

[51] Int. Cl.$^6$ .......................... H04M 11/00; H04L 12/28; H04J 3/12; H03M 13/00
[52] U.S. Cl. ............................ 379/93.01; 379/93.15; 370/410; 370/522; 371/35; 371/37.1
[58] Field of Search .............................. 379/90.01, 93.01, 379/93.05–93.09, 93.11, 93.14–93.15, 93.28–93.29, 93.31, 93.33, 93.37; 370/254–256, 352, 389, 392, 395, 400–408, 465–467, 410, 522, 527–529; 371/35, 37.01–37.02, 48, 49.1; 395/185.02, 185.05, 185.09; 364/265.1–265.3, 266.3, 944.5, 945.6

[56] References Cited

U.S. PATENT DOCUMENTS

| | | | |
|---|---|---|---|
| 5,341,374 | 8/1994 | Lewen et al. | 370/405 |
| 5,394,407 | 2/1995 | Coddington | 371/37.01 |
| 5,426,652 | 6/1995 | Heiman | 371/37.01 |
| 5,459,741 | 10/1995 | Iwamura | 371/37.01 |
| 5,596,604 | 1/1997 | Cioffi et al. | 371/35 |
| 5,636,231 | 6/1997 | Huang et al. | 371/37.01 |

*Primary Examiner*—Curtis A. Kuntz
*Assistant Examiner*—George Eng
*Attorney, Agent, or Firm*—W. Glen Johnson

[57] ABSTRACT

A system and method for transmitting aural signals across a wide area network (WAN) from a local phone coupled to a computer, e.g., a PC-phone, to a remote phone coupled to a KTS, PBX, or PSTN, for example. This capability is provided by the gateway unit of the present invention. The system of the present invention is quickly installed in a server or a personal computer coupled to a local area network. The system is connected to one or more of a PSTN, a private branch exchange, a key telephone system, a telephone, a facsimile machine, and a modem. In the case of voice transmission, a gateway unit translates received telephony signal into a format that is compatible with the telephone system or equipment connected thereto. The present invention can provide a voice quality that approaches, equals, or exceeds the voice quality of conventional telephone switched networks. This high voice quality is achieved by utilizing a high quality voice digitization algorithm on both the PC-phone and the gateway, by ensuring a low maximum network delay between the PC-phone and the gateway, by permitting a dynamic compensation for variations in network delay, and by utilizing a forward error correction technique for transmission over WANs that can recreate lost or delayed signals in a manner that recreates the signal so the lost signal is typically not detectable by a user.

52 Claims, 11 Drawing Sheets

SYSTEM AND METHOD FOR TRANSMITTING AURAL INFORMATION BETWEEN A COMPUTER AND TELEPHONE EQUIPMENT

CROSS-REFERENCE TO A RELATED APPLICATION

The subject matter of this application is related to the subject matter of U.S. patent application Ser. No. 08/634,927, attorney docket number 2341, titled "SYSTEM AND METHOD FOR TRANSPARENTLY TRANSMITTING AURAL INFORMATION THROUGH A WIDE AREA NETWORK", filed on Apr. 19, 1996 by Guy et al, which is incorporated by reference herein in its entirety.

BACKGROUND OF THE INVENTION

1. Field of the Invention

The present invention relates generally to the field of telecommunications and more particularly to the field of transmitting aural information through a wide area network.

2. Description of Background Art

Conventional aural communication is accomplished using a public switched network, e.g., the telephone network. Through the use of such a public switched network users can easily communicate with each other by transmitting aural signals from a first terminal to a second terminal through the public switched network. The aural signals can represent voice data, modem data, or facsimile (fax) data, for example. In order to transmit voice data, a user performs a conventional procedure for setting up a call, and for tearing-down a call. In one example of a conventional call setup procedure, a user lifts a handset on a first telephone, listens for a dial-tone, and then enters a code identifying a destination telephone. A user at the destination telephone is notified that a connection is pending, e.g., by hearing the destination telephone ring, and the user lifts the handset. After the handset of the destination telephone is lifted, a connection between the first telephone and the destination telephone is established. As each user speaks, the sound is transformed and then transmitted through the telephone, through a private branch exchange (if any), through the public switched network, and then to the destination telephone where the transformed signal is re-transformed into an audible signal that can be heard by the user at the destination telephone.

Recently, communication systems have been developed that enable aural data to be transmitted over a wide area network (WAN). In these systems a private branch exchange (PBX) is connected to a communication device, e.g., a router, switch, FRAD, or multiplexor, that connects two networks having different data formats, e.g., a local area network (LAN) and a WAN. An example of a data format is a packet. A packet is a group of bits having a header portion and a data portion. The format of a packet can be different for each LAN and WAN. For example, the maximum size of a packet, packet destination information, and routing information can differ between networks. A router or a switch, hereafter referred to as a router, that handles aural data can convert a packet from a first format that is compatible with the PBX to a second format that is compatible with a WAN. After receiving the aural signals from the PBX, the router converts the aural signals into packets and transmits the packets across a WAN where they are received by a second router that is connected to a second PBX, key system or telephone. The second router converts the packets into aural signals and transmits the signals to the PBX, key system or telephone. There are problems with connecting a source of aural information directly to a router. One problem is that the format of aural information and the format of information that can be received by the network router are typically incompatible and, in general, a specially developed router must be used to enable the PBX to transmit data through a WAN. A second problem is that routers are, typically, not capable of being inexpensively modified to receive telephony functionality, for example, it is difficult to add a circuit board having the required telephony functionality to a router. Accordingly, in order to add telephony compatibility and functionality to a WAN, a WAN user must replace the existing routers. This is an expensive solution. A third problem is routers that are compatible with a PBX or a KTS generally provide proprietary solutions that are not compatible with those of other routers. A fourth problem is that such solutions are not generally available in routers, thus limiting the options of a user.

Another technique for transmitting aural signals across a WAN is to connect a microphone and a speaker to a conventional personal computer (PC). A user loads and executes a software program that converts the received analog signal to a digital signal using the processor in the PC. Such a system is called a PC-phone. Alternatively, a PC-phone may comprise a PC with a phone attached thereto, where the PC loads and executes a software program that converts the received signal to a digital signal using the processor in the PC and telephony interface module. The signal may be sent over a LAN to a router. The router transmits the signal over a WAN to a second router. The second router may transmit the signal over a second LAN or directly to a destination PC. If the destination PC is operating compatible software, the PC can convert the received signal back to an audible signal that is transmitted through the PC's speakers or to a phone attached to the PC. While this technique is less expensive than the first technique, it also has limitations. One limitation is that such systems are currently incapable of providing a priority mechanism that would ensure that aural data arrives within a predetermined maximum time period. Most data currently transmitted through WANs is not time sensitive, i.e., a small delay in receiving data is acceptable if the data is accurate. However aural communication is time sensitive, i.e., it is generally more important for aural data to be received in a timely manner than it is for the data to be absolutely accurate. If, while a user is speaking into a microphone, another computer that is coupled to a router via the LAN requests a transfer of a large file, e.g., a computer aided design (CAD) file, the packets of voice data that are received by the first router after the first router begins transmitting the packets of the CAD file may incur a significant delay if the router transmits all of the packets of the CAD file before transmitting the aural packets. In this situation, the second user will experience a significant delay in the reception of aural signals and will experience reduced signal quality.

A second limitation is that both aural communication devices must be coupled to each other through similarly equipped computers and through a common data network, such as the Internet. Conventional systems do not have the ability to connect a PC-phone with a conventional telephone through the public switched telephone network (PSTN).

A third limitation is that conventional systems do not provide a near toll-quality signal. A near toll-quality-signal is defined as a signal within 0.5 point of the toll quality signal as measured by the means-opinion-score (MOS) method, on a scale of five, as determined by listening tests. The MOS method is described in greater detail in *ITU-T*

Recommendation P.83, *Subjective Performance Assessment of Telephone-Band and Wideband Digital CODECS,* (March 1993), that is incorporated by reference herein in its entirety.

Accordingly, what is needed is a system and method: (1) for transmitting aural information as digital signals over a wide-area-data-network; (2) that permits the use of a robust error correction procedure that enables a receiver to recreate lost data; (3) that converts aural signals into a network compatible format, and that performs compression and decompression algorithms on the converted data; (4) that uses a router/switch priority system to minimize the end-to-end packet delay across a wide area network; (5) that adjusts the destination signal based upon packet delay variations; (6) that communicates with a PC-phone over a standard LAN and/or WAN connection without requiring a specialized voice interface; (7) that can connect to a LAN with a standard interface and can communicate over the LAN in standard data formats; (8) that accepts telephony information from a PC-phone and utilizes that telephony information to place a call to a phone, PBX, KTS, or the public phone network; and (9) that connects to telephone equipment and networks through standard telephony interfaces.

SUMMARY OF THE INVENTION

The invention is a system and method for transmitting aural signals across a wide area network (WAN) from a local phone coupled to a computer, e.g., a PC-phone, to a remote phone coupled to a KTS, PBX, or PSTN, for example. This capability is provided by the gateway unit of the present invention. The system of the present invention is quickly and inexpensively installed in a server or a personal computer coupled to a local area network. The system is connected to one or more of a PSTN, a private branch exchange, a key telephone system, a telephone, a facsimile machine, and a modem. In the case of voice transmission, a user places a telephone call using a personal computer with telephony software and a telephone or a microphone/speaker interface. The computer generates telephony signals representing signaling information and aural data and transmits those signals across a local area network (LAN) and/or a WAN to a gateway unit of the present invention. The gateway unit translates the received telephony signal into a format that is compatible with the telephone system or equipment connected thereto. The present invention can provide a voice quality that approaches, equals, or exceeds the voice quality of conventional telephone switched networks. This high voice quality is achieved by utilizing a high quality voice digitization algorithm on both the PC-phone and the gateway, by ensuring a low maximum network delay between the PC-phone and the gateway, by permitting a dynamic compensation for variations in network delay, and by utilizing a forward error correction technique for transmission over WANs that can recreate lost or delayed signals in a manner that recreates the signal so the lost signal is typically not detectable by a user.

The benefits of the present invention include: (1) transmitting aural information as digital signals to and from a PC-phone over a LAN and/or WAN; (2) permitting the use of a robust error correction procedure that enables a receiver to recreate lost data; (3) converting aural signals into a network compatible format, and performing compression and decompression algorithms on the converted data; (4) using a router/switch priority system to minimize the end-to-end packet delay across a wide area network; (5) adjusting the destination signal based upon packet delay variations; (6) communicating with a PC-phone over a standard LAN and/or WAN connection without requiring a specialized voice interface; (7) connecting to a LAN with a standard interface and communicating over the LAN in standard data formats; (8) accepting telephony information from a PC-phone and utilizing that telephony information to place a call to a phone, PBX, KTS, or the public phone network; and (9) connecting to telephone equipment and networks through standard telephony interfaces.

DETAILED DESCRIPTION OF THE PREFERRED EMBODIMENT

A preferred embodiment of the present invention is now described with reference to the figures where like reference numbers indicate identical or functionally similar elements. Also in the figures, the left most digit(s) of each reference number correspond(s) to the figure in which the reference number is first used.

Figure 1:
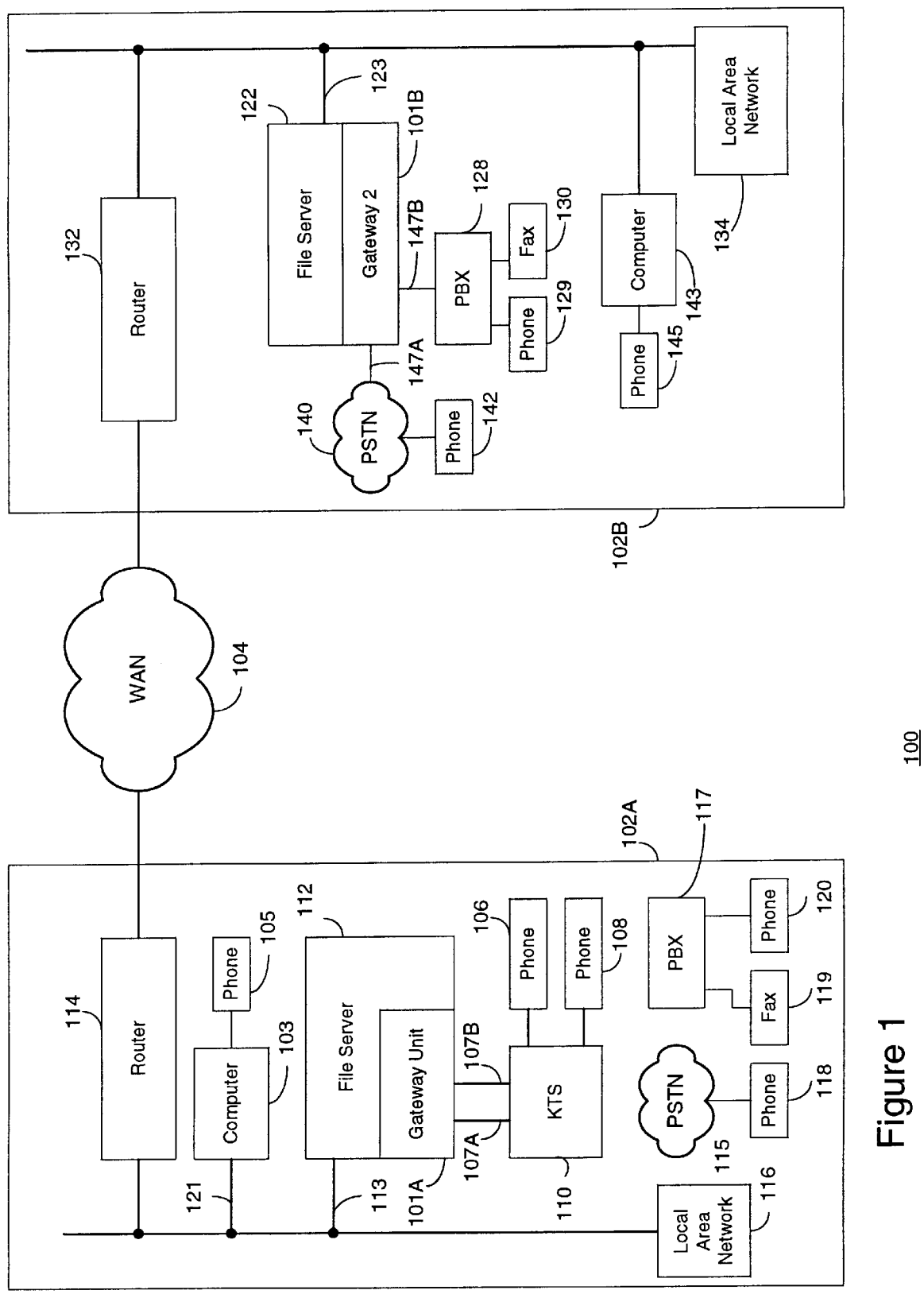
FIG. 1 is an illustration of a computer network environment in which the preferred embodiment of the present invention operates.

FIG. 1 is an illustration of a computer network environment in which the preferred embodiment of the present invention operates. FIG. 1 illustrates a first local configuration 102A coupled to a second local configuration 102B by a wide area network (WAN) 104. The first and second local configurations include a router 114, 132, file servers or personal computers (PCs) 112, 122, 103, and 143 and local area networks (LAN) 116, 134. Examples of LANs include an ethernet and a token ring network, examples of a WAN include leased lines, frame relay, asynchronous transfer mode (ATM) networks, and the Internet. The present invention enables a user to transmit aural signals across a WAN using conventional telephones, facsimile machines (fax), and modems. It will be apparent to persons skilled in the relevant art that the present invention can operate on many different types of LANs and WANs without departing from the scope of the present invention. The first local configuration 102A includes two telephones 106, 108 coupled to a key telephone system (KTS) 110. In one embodiment of the present invention, a KTS 110 is coupled to a gateway unit (GU) 101A located on a PC or a file server 112 via signal lines 107. In addition, additional aural equipment are connected to the KTS via a PSTN public phone system 115 (phone 118) and a PBX 117 (fax 119 and phone 120) connected to the PSTN 115. In the preferred embodiment, the GU 101 is located on a server. Accordingly, the description of the GU 101 will be with respect to a file server and is described in greater detail below. As described below, in an alternate embodiment, the GU 101 is configured in a PC or other host processor system. The file server 112 is connected to the LAN via a network interface 113. A PC-phone system 103/105 includes a computer 103 and a phone 105 and is coupled to the LAN 116. The network interface 113 is coupled to the router 114 via the LAN 116. The router 114 receives data from devices, e.g., the file server 112, in the first local configuration 102A. The first local configuration can include all telephones and computer phones in a local area, e.g., in Fairfax, Va., that are connected to the WAN 104, the PSTN 115, the LAN 116, the KTS 110, or the PBX 117, for example. The data can be in the form of packets, as described below. The router 114 transmits the packets from the local configuration 102A to the WAN 104 and then the packets are routed through the WAN 104 to a second router 132 in the second local configuration 102B, e.g., in London, England or in Ardara, Ireland. In an alternate embodiment of the present invention, a network switch or hub can be used in conjunction with, or in place of, the routers 114, 132. As described in detail below, although two gateway units 101A, 101B are illustrated in FIG. 1, if a first user is operating a PC-phone, e.g., a phone connected to a LAN through a computer or a computer having a microphone and speakers, then communication between the first user and a second user using a conventional phone, e.g., destination phone 142 that is coupled to a PSTN 140, then the aural data and signaling traffic are received and interpreted by only one GU, e.g., GU 101B.

The second local configuration 102B includes a second file server 122 having a GU 101B that is coupled to a PBX 128 which can be coupled to many telephones and faxes, e.g. phone 129 and fax 130. The GU 101B is also coupled to a PSTN 140 which can provide a connection to any aural device connected thereto, e.g., phone 142. A feature of the present invention is that the GU 101 provides an interface to the PSTN 140 and the PBX 128 in contrast to conventional PC-phone systems that only provide an interface to other PC-phones. The second LAN 102B can also coupled to a phone/fax server central site unit (CSU) (not shown) in lieu of or in addition to the file server 122. The CSU is a PC that only performs operations related to the operation of the one or more gateway units located therein. The CSU can contain multiple GUs 101 and is, generally, more reliable than either stand alone PCs or file servers because PCs and file servers typically also perform operations and run application programs not related to the GU 101. The second local configuration 102B includes a network interface 123 that communicates through the LAN 134 to the router 132, the second file server 122, and the remaining devices attached to the LAN 134. A PC-phone system 143/145 is also coupled to the LAN 134.

The present invention is a system and method for enabling aural signals, e.g., voice signals, facsimile (fax) signals, and modem signals, to be generated and transmitted from a telephone, e.g., a PC-phone, to another telephone that is coupled to a PSTN 140, by having a GU 101B coupled to the PSTN 140 where the GU 101B allows communication between a phone 142 connected to a PSTN 140 and another phone or PC-phone connected to LAN 134 or LAN 116 over WAN 104. The GU 101 is located in either a file server 122 coupled to a computer network or in a personal computer coupled to a first local configuration 102A. The file server 122 performs a setup operation to prepare a connection between two aural signal generation devices, e.g., between the PC-phone system 103/105 in the first local configuration 102A and a destination telephone, i.e., a second telephone 142, in a second local configuration 102B. If the PC-phone system 103/105 initiates a call, the computer 103 sets-up the connection, converts the received aural signals into digital signals and compresses the digital signals, as described below. An example of a PC-phone system is VocalTec's Internet Phone that is commercially available from VocalTec Ltd., Northdale, N.J. Packets are generated from the compressed digital signals and these packets are transmitted to the router 114 via the network connection 113. The router 114 transmits the packets across a wide area data network (WAN) 104, e.g., leased lines, frame relay, or the Internet, and the packets are received by the second router 132 in the second local configuration 102B. The second router 132 transmits the packets to the destination server 122. The gateway unit 101B in the destination server 122 converts the compressed digital signals in the packet into analog signals that utilize the PSTN signal protocol or the PBX signal protocol for the second local configuration 102B and transmits the signal to the (target) second telephone 142 that is connected to PSTN 140 or telephone 129 connected to PBX 128. A more detailed description of the operation of the present invention is set forth below.

The present invention provides a cost-effective system and method for transmitting aural information from an aural signal generating device that is connected to a first local configuration 102A to an aural signal receiving device, e.g., a telephone 118 attached to the PSTN 115 and access within the local configuration 102A through GU 101A, or a second telephone 142, connected to a second local configuration 102B, where the first local configuration 102A and the second local configuration 102B are connected by a WAN 104. As described above, an aural signal generating device and an aural signal receiving device can be, for example, a telephone (including a PC-phone), a fax, or a modem. The present invention can reside in a server 112 or in a personal computer, for example. In contrast, previous systems couple a PBX, key system, or telephone, directly to a router 114. Routers are typically designed such that the user does not have the capability to add functionality thereto, other than that functionality provided by the manufacturer of the router. Accordingly, a router designer and manufacturer must include the aural transmission capability in the router. The user is thereby unable to modify an existing LAN environment to add voice communication capability that can access the PSTN, PBX, or KTS without replacing the existing routers at a significant expense. PC-phone technology enables communication between similar PC-phones over a router-based network, but does not enable access off the network, i.e., communication with a PBX, KTS, or PSTN. The present invention enables a user of a LAN and/or LAN/WAN network to quickly and inexpensively add a near-toll-quality, PSTN, PBX, or KTS gateway capability to a network by installing hardware and software in a PC that is coupled to a LAN in the network. As described above, previous attempts at providing such functionality have provided solutions that are of lesser quality and are generally not acceptable for business use because the quality of the aural signal is low and, in previous systems, PC-phones have only been able to communicate with other compatible PC-phones, i.e., conventional systems do not enable PC-phones to communicate with conventional phones through a public telephone network, e.g., a PSTN, or a PBX.

In the preferred embodiment, the present invention includes a GU 101 that is controlled by software, as described below. Preferably, the GU 101 is located in one PC, one file server 112, or a dedicated CSU per office or LAN site. File servers 112, and CSUs, are typically always operating. In contrast, a PC is generally less available because a user may turn off the PC or operate less robust programs than on a server 112 which can cause the PC to fail. However, in an alternate embodiment, one or more GUs 101 can be installed in a PC that is connected to a LAN, e.g., for use in an office without a server on the LAN. For ease of discussion, the description set forth below will describe a telephone call between a user utilizing a PC-phone system 103/105 and a user at a second telephone 142 wherein the user of the PC-phone 105 initiates the call and where the PC-phone 105 is coupled to a router 114 via computer 103 and a network interface 121 and the second telephone is coupled to the GU 101B in the destination server 122 via a PSTN 140, as illustrated in FIG. 1.

Figure 2:
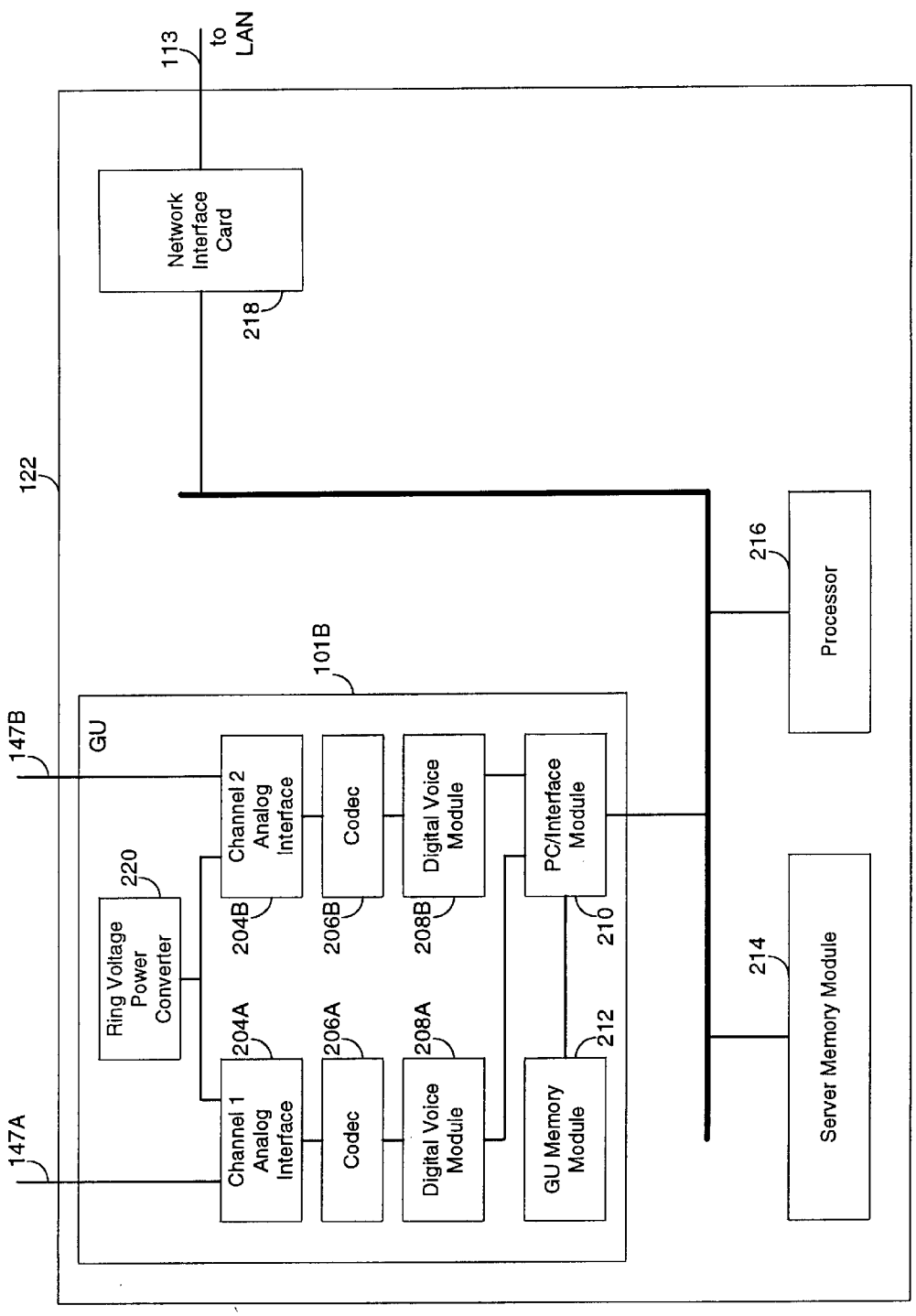
FIG. 2 is a more detailed illustration of a PC/file server, and a gateway unit installed therein, having an analog telephony interface according to the preferred embodiment of the present invention.

FIG. 2 is a more detailed illustration of a file server 122 and a GU 101 having an analog telephony interface according to the preferred embodiment of the present invention. With respect to the present invention, the first file server 112 and the second file server 122 each has a GU 101, and each operates in substantially the same manner. Any distinctions between the operation of the present invention and any of these devices are apparent to persons skilled in the relevant art. The file server 122 can be a conventional PC that is utilized as a file server. The file server 122 includes a network interface card (NIC) 218, a processor 216, a server memory module 214, and a GU 101B. The NIC 218 can be a conventional NIC, for example, a 3C509 NIC that is commercially available from 3Com Corp., Santa Clara, Calif. The NIC 218 converts signals from the file server 122 into a format used by the LAN 134. A benefit of the present invention is that the GU 101 installs and operates in a standard manner that is compatible with the operating system of the server, e.g., Novell NetWare, Microsoft DOS, Microsoft Windows 95, or Microsoft Windows NT server. The present invention utilizes the capabilities of the NIC 218 to convert the signals into the format used by the LAN 134. This simplifies the design and cost of the GU 101. The processor 216 of the file server 102A can be an x86 based processor or a Pentium Pro processor, for example, manufactured by Intel Corporation, Santa Clara, Calif. The server memory module 214 is a conventional random access memory (RAM) that includes an operating system and non-conventional application programs stored therein. The server memory module 214, and the non-conventional application programs are described in greater detail below.

The analog GU 101B includes a ring voltage power converter 220, two channel analog interfaces 204, two coder-decoders (CODECS) 206, two digital voice modules (DVMs) 208, a PC interface module 210, and a GU memory module 212. The first and the second channel analog interfaces 204 are connected to a trunk line of a PBX 128 and a PSTW 140, respectively. In general, each channel analog interface 204 connects to a telephony interface, e.g., a PSTN, a PBX, a KTS, telephones, faxes, and modems. Each channel analog interface 204 also provides ring voltages for foreign exchange station (FXS) interfaces and for ear and mouth (E&M) interfaces. If the analog interface 204 is connected to a foreign exchange office (FXO), the analog interface 204 performs conventional ring detection, loop closure, loop open detection, and 2 to 4 wire conversion using, for example, transformers or solid state circuitry. When connected, for example, to a PBX trunk line by an E&M interface, a PBX, a leased line, or an FXO interface, the GU Channel Analog Interface 204 indicates to the PBX that it wished to call a phone attached to the PBX by sending a ring signal to the PBX. The PBX then typically responds by going off-hook, at which time the GU sends the digits designating the destination phone number to the PBX and opens the voice circuit to allow the user to hear call progress, ring, and busy signal and to hear the party answering the phone.

When connected to the PSTN by an FXS interface, a GU Channel Analog Interface 204 signals the PSTN 140 that it wishes to place a call by going off hook. The PSTN detects the off-hook condition and generates a dial tone to the channel analog interface 204. Upon detection of the dial tone, the server 122 and GU 101 transmit digits designating the destination phone 142 to the PSTN 140 and open the voice circuit to allow the user the hear call progress, ring, busy, and other PSTN signals and to hear the party answering the destination phone 142.

The CODEC 206 is a conventional CODEC, for example, model number 3070, that is commercially available from National Semiconductors, Santa Clara, Calif. The CODEC 206 receives analog signals from the channel analog interface 204 and converts these signals into a digital signal, e.g., a pulse code modulation (PCM) signal using a conventional conversion technique. The rate of the bit stream generated by the CODEC is 64 kilobits per second (kbps). These bits are sent to the DVM 208. The DVM determines the type of signal represented by the bits, e.g., a voice signal, a fax signal or a modem signal, then the bits are framed and sent to the PC/interface module 210. If the bits represent a voice signal, then the DVM 208 compresses the bits, generates correction information that is used to regenerate information that may be lost during transmission, organizes the bits and the correction information into frames, and transmits the frames to the PC/interface module 210. The PC/interface module 210 stores the frames in the GU memory module 212 and notifies the server 122 that a frame is available. The operation of the GU 101 is described in greater detail below.

Figure 3:
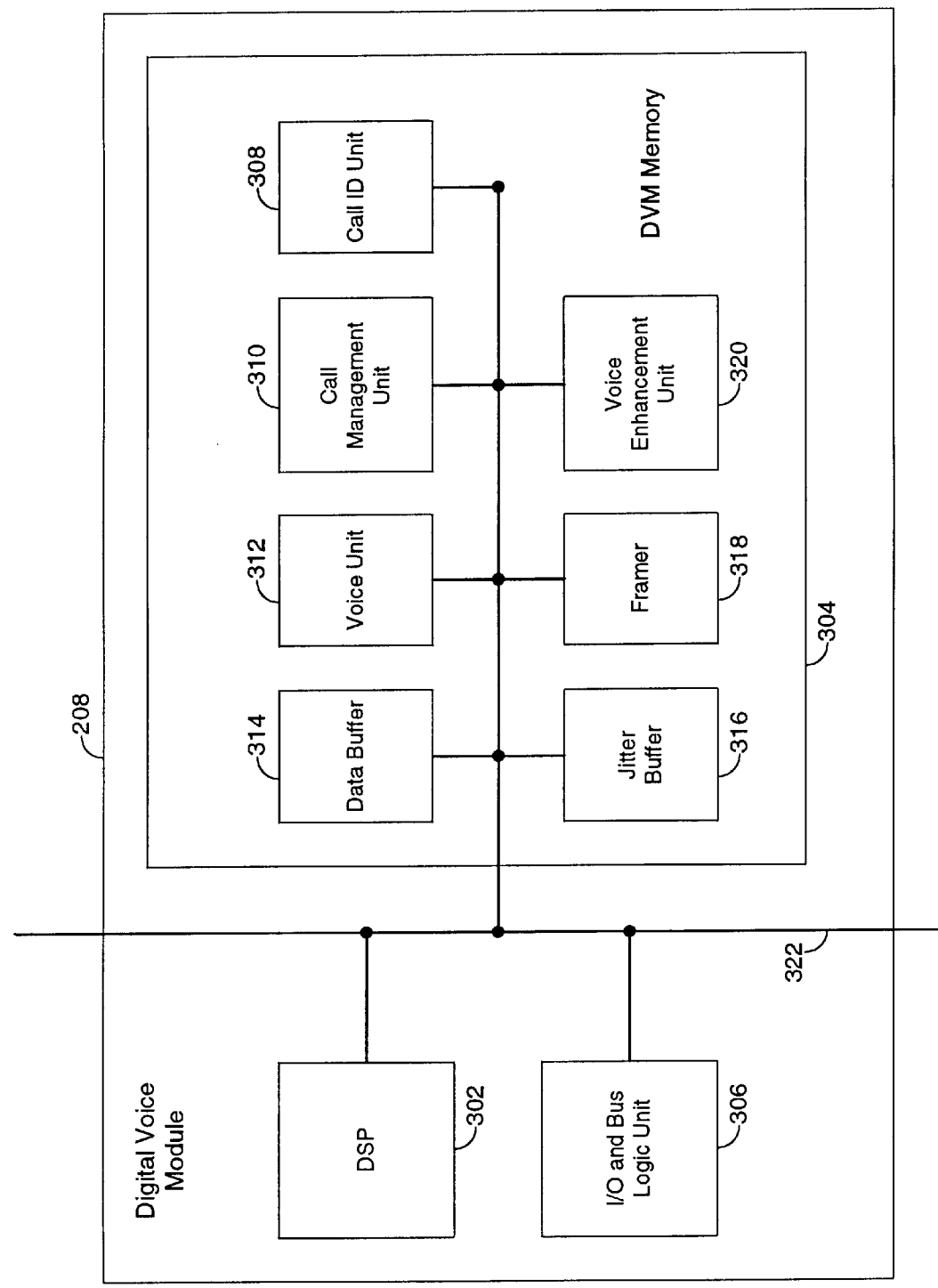
FIG. 3 is a more detailed illustration of a digital voice module component of the gateway unit according to the preferred embodiment of the present invention.

FIG. 3 is a more detailed illustration of the DVM 208 according to the preferred embodiment of the present invention. The DVM 208 includes a digital signal processor (DSP) 302 coupled to a data bus 322. In addition, the DVM 208 includes an input/output (I/O) and bus logic unit 306 and a DVM memory module 304 each of which is coupled to the data bus 322. The DSP 302 is a conventional processor, e.g., a TI 320C52-80 DSP that is commercially available from Texas Instruments Inc., Dallas, Tex. The I/O and bus logic unit 306 includes conventional address decoding logic and bus interface logic. The DVM memory 304 is comprised of conventional memory, e.g., static random access memory (SRAM), and flash erasable programmable read only memory (EPROM). The DVM memory 304 stores a data buffer 314 and a Call ID Unit 308 that, when executed by the DSP 302, determines the type of signals received, e.g., voice, fax, or modem signals. Depending on the type of signals received, the Call ID Unit 308 instructs the DVM 208 to store various other functional modules in the DVM memory 304. If the received signals are either fax signals or modem signals, a framer 318 and a call management unit 310 are stored in the DVM memory 304 for creating data frames from the received data. If the received signals are voice signals, then the Call ID unit 308 instructs the DVM 208 to store a call management unit 310, a voice unit 312, a jitter buffer 316, a framer 318, and a voice enhancement unit 320 in the DVM memory 304.

The functional modules operate in conjunction with the DSP 302. The call management unit 310 receives signals representing destination phone identifiers, e.g., the digits dialed to designate the destination phone. The call management unit 310 also determines when a preferred number of signals, representing dialed digits, are received and transmits these digits to the PC/interface module 210. The call management unit 310 also performs other telephony functions including echo canceling, DTMF tone detection and generation, pulse dialing, modem and fax tone detection and generation, and generating instructions requesting the generation of a ring voltage. In addition, the call management unit 310 controls the interface into a PBX and a PSTN over the analog channel interface 204. One example of such an interface is described in Electronic Industries Association/Telecommunication Industry Association (EIA/TIA) 464-A, Private Branch Exchange (PBX) Switching Equipment for Voiceband Application, February 1989. The voice unit 312 receives the 64 kbps bit stream from the CODEC 206A and converts the bit stream into an 8 kbps bit stream using a conventional compression technique. The voice unit 312 also decompresses a bit stream received from the PC/interface module 210 and transmits the decompressed signal to the CODEC 206, e.g., when the DVM 208 receives voice signals. The data buffer 314 temporarily stores data until the data is transmitted to either the CODEC 206 or the PC/interface module 210. The jitter buffer 316 is a variable length buffer that stores voice signals received from the PC/interface module 210. The size of the jitter buffer is dependent upon the variation in the end-to-end packet delay in the network and can be dynamically adjusted based upon, for example, this packet delay variation.

The voice enhancement unit 320 performs a forward-error-correction (FEC) operation to generate bits that can be used to recreate a lost packet. In general, the FEC operation will only be enabled if both aural devices, e.g., PC-phone system 103/105 and the second phone 142 support FEC. In addition, the FEC function is typically not used when both aural devices communicate solely over a LAN, e.g., communication between PC-phone system 103/105 and phone 118, because the data-loss-rate is generally low in such a configuration. In an alternate embodiment, the voice enhancement unit can be a part of the server memory module 214. When receiving voice signals, the voice enhancement unit 320 performs the packet recreation process. The voice enhancement unit 320 also generates a time stamp that identifies the sequencing of packets, allowing the destination server to estimate when a subsequent packet of data is to be received. If this time expires before the subsequent packet is received, the voice enhancement unit of the destination server 320 recreates the packet. The packet recreation technique is described below. The voice enhancement unit 320 also dynamically measures the end-to-end delay in the network and adjusts the size of the jitter buffer 316 accordingly, as described above. The voice enhancement unit 320 can also dynamically adjust the rate of the bit stream from 8 kbps in the preferred embodiment to a slower rate, e.g., 6.4 kbps or 4.8 kbps. The framer 318 creates a frame that includes data representing a predetermined amount of voice signals, e.g., 20 milliseconds (ms). The framer 318 can also includes time stamp information, and, if selected, FEC information in a frame. The operation of the DVM 208 is described in greater detail below.

Figure 4:
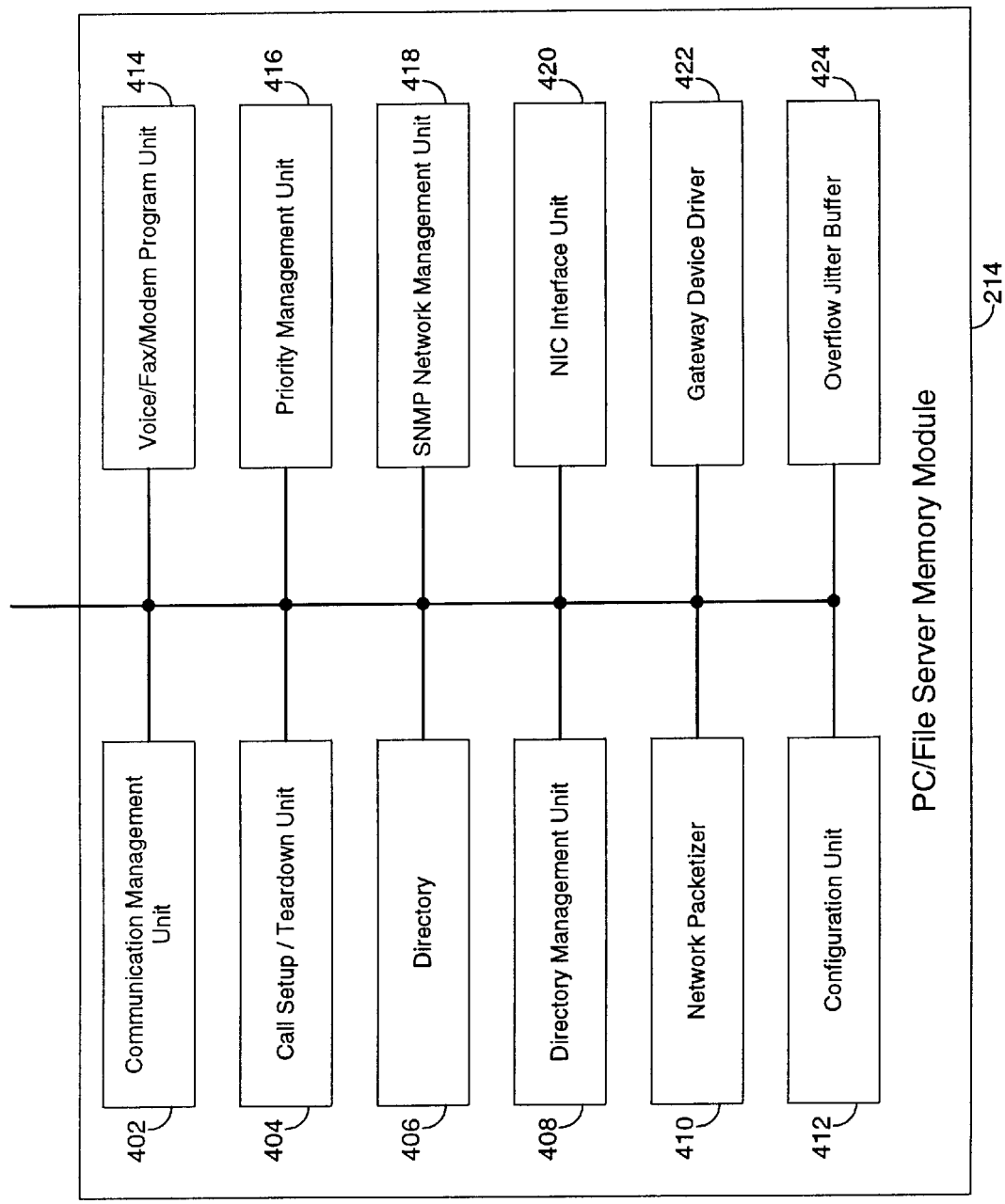
FIG. 4 is a more detailed illustration of a PC/file server memory module according to the preferred embodiment of the present invention.

FIG. 4 is a more detailed illustration of the server memory module 214 according to the preferred embodiment of the present invention. The server memory module 214 is a conventional random access memory (RAM) that includes non-conventional application programs. These application programs include a communication management unit 402, a call setup/tear-down unit 404, a directory 406, a directory management unit 408, a network packetizer 410, a configuration unit 412, a voice/fax/modem program unit 414, a priority management unit 416, a standard network management protocol (SNMP) network management unit 418, a NIC interface unit 420, a gateway device driver 422, and an overflow jitter buffer 424.

The communication management unit 402 determines the type of data that a received frame or packet represents, e.g., voice, fax, modem, or another type of data. Based upon this determination, the communication management unit 402 calls the other various functional programs to properly evaluate and transmit the data. The call setup/tear-down unit 404 performs and controls the call setup procedure and the call tear-down procedure, as described below. The directory includes server code identifiers and a network address associated with each destination phone identifier. The directory management unit 408 controls access to the directory. In addition, when the GU 101 initiates a call, the directory management unit 408 can request that a search be performed in a master directory for a destination phone identifier code that in not is the local directory, e.g., directory 406. The master directory is located at one server in the network 100 and typically contains the most current version of the network directory. In some network environments, the master directory transmits its contents periodically, e.g., daily, to all of the local directories in the network 100. When transmitting data, the network packetizer creates a packet of data that includes one or more frames and adds a packet header that includes the network address of the destination server 122. When receiving data, the network packetizer receives a packet, and removes the packet header. The configuration unit 412 includes information identifying each of the one or more GUs 101 on the server 122 and information identifying each channel address for each GU 101. In addition, the configuration unit 412 includes information identifying the type of dial tone, ring tone, and call progress tone, e.g., as used in a particular country, and the type of telephony service on each channel, e.g., FXO, FXS, or E&M.

The voice/fax/modem program unit 414 includes functional program modules that are transferred into the DVM memory 304, e.g., the voice unit 312 and the voice enhancement unit 320. The priority management unit 416 controls the data priority request process, as described below. The SNMP network management unit 418 controls the conventional SNMP for the server. The SNMP permits remote reporting of the server status and modification of server configuration parameters, e.g., modification of the jitter buffer size and enablement and disablement of the FEC process. The NIC interface unit converts the packets into a format that is compatible with the LAN attached to the server, e.g., ethernet or token ring. The format, e.g., the protocol, required by these LANs is known and the procedure for converting a data packet to a compatible format is apparent to persons skilled in the relevant art. The gateway device driver 422 enables the server to communicate with the GU 101 by providing, for example, a conventional interrupt process to transfer data and management information between the server and the GU 101. The overflow jitter buffer 424 permits data to be temporarily stored when network delay variation is larger than what can be properly handled by the jitter buffer 316. The functions performed by the functional programs are described in greater detail below with reference to FIGS. 7–8.

Figure 5:
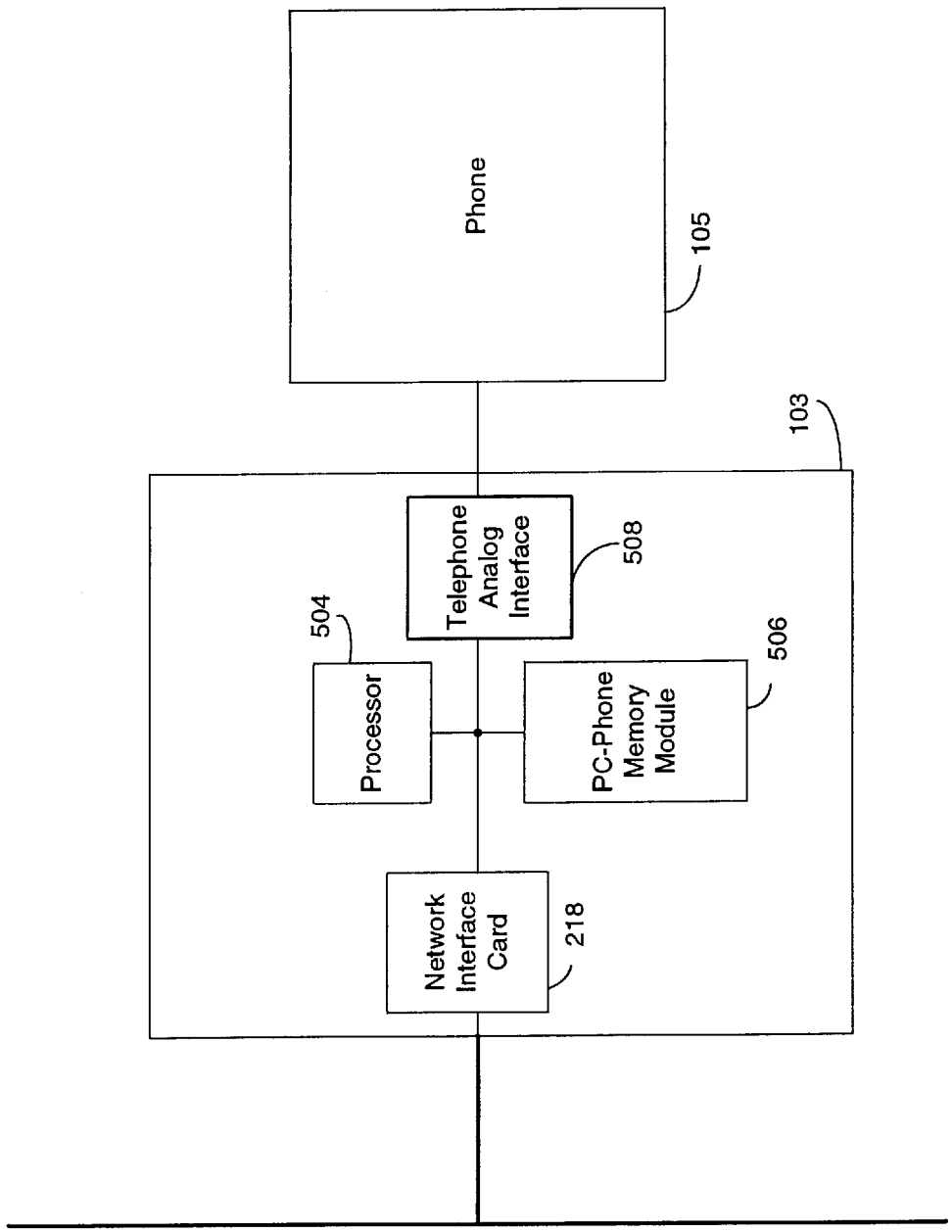
FIG. 5 is an illustration of a PC-phone system including a computer and a PC-phone according to a preferred embodiment of the present invention.

FIG. 5 is an illustration of a PC-phone system capable of communication with the gateway unit of the present invention including a computer 104 and a PC-phone 105 according to a preferred embodiment of the present invention. The phone 105 can be a conventional telephone coupled to the computer 103 or, as described above, the phone can be a microphone and a speaker of the computer 103, for example. The computer 103 can be a conventional computer having a processor 504, e.g., a Pentium processor, a network interface card 218, whose operation is described above, and a PC-phone memory module 506, and a telephone analog interface 508. The PC-phone memory module 506 is a conventional storage device having non-conventional computer programs stored therein. The PC-phone memory module 506 is described in greater detail below with respect to FIG. 6. The telephone analog interface 508 provides an analog interface to phone 105, a CODEC, and a digital interface to the PC internal bus. The telephone analog interface 508 is a conventional telephone interface, e.g., model PhoneBlaster 28.8 PNP, commercially available from Creative Labs, Inc., Milpitas, Calif. The telephone analog interface 508 provides an analog telephony attachment for signals received from the phone 105 in a manner similar to channel analog interface 204A and transmits aural signals received from the LAN 116 to the CODEC in telephone analog interface 508 for translation into a form recognizable by the phone 105. In addition, the telephone analog interface 508 can be an interface for fax and modem traffic.

Figure 6:
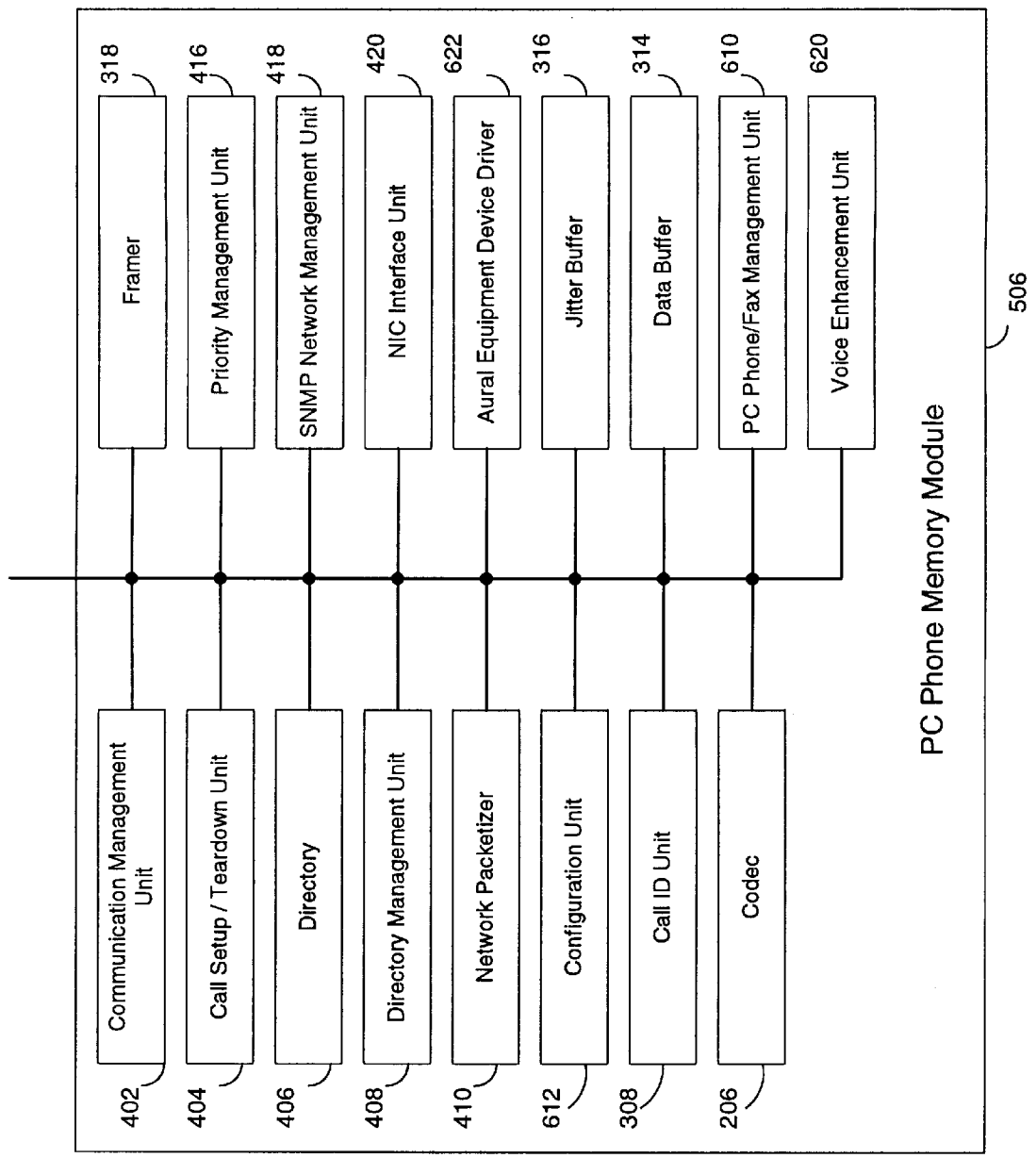
FIG. 6 is an illustration of a PC-Phone memory module according to the preferred embodiment of the present invention.

FIG. 6 is an illustration of the PC-Phone memory module 506 according to the preferred embodiment of the present invention. The PC-phone memory module 506 includes a communications management module 402, a call setup/teardown unit 404, a directory 406, a directory management unit 408, a network packetizer 410, a digital voice module 208, a call ID unit 308, a framer 318, a priority management unit 416, a SNMP network management unit 418, a NIC interface unit 420, a jitter buffer 316, and a data buffer 314. The operation of these units is described above with reference to the gateway unit 101 and the file server 122. In addition, the PC-phone memory module 506 includes a configuration unit 612, a PC phone/fax management unit 610, a voice enhancement unit 620, and an aural equipment device driver 622. The configuration unit 612 includes information on the configuration and type of PC-phone 105. The aural equipment device driver 622 is conventional and enables the PC 105 to communicate with the telephone analog interface 508. The voice enhancement module 620 is an optional module in the PC phone memory module and provides forward error correction (FEC) capability to the PC-phone system 103/105. A description of the FEC capability of the present invention is described below.

In alternate embodiments, the PC-phone memory module 506 does not include all of the elements and does not provide all of the capability described above with reference to FIG. 6. For example, the communication management unit 402 is not required if the computer is coupled only to a telephone, or operates only as a telephone, e.g., if the computer does not handle fax communication. In addition, the priority management unit 416 and the SNMP network management unit 418 are optional units in the PC-phone memory module 506 since the present invention can operate over a WAN 104 that does not have a priority protocol, and the remote reporting and server (PC) status and modification functions performed by the SNMP network management module 506 are also not required for the basic operation of the present invention in the PC-phone system 103/105.

Figure 7:
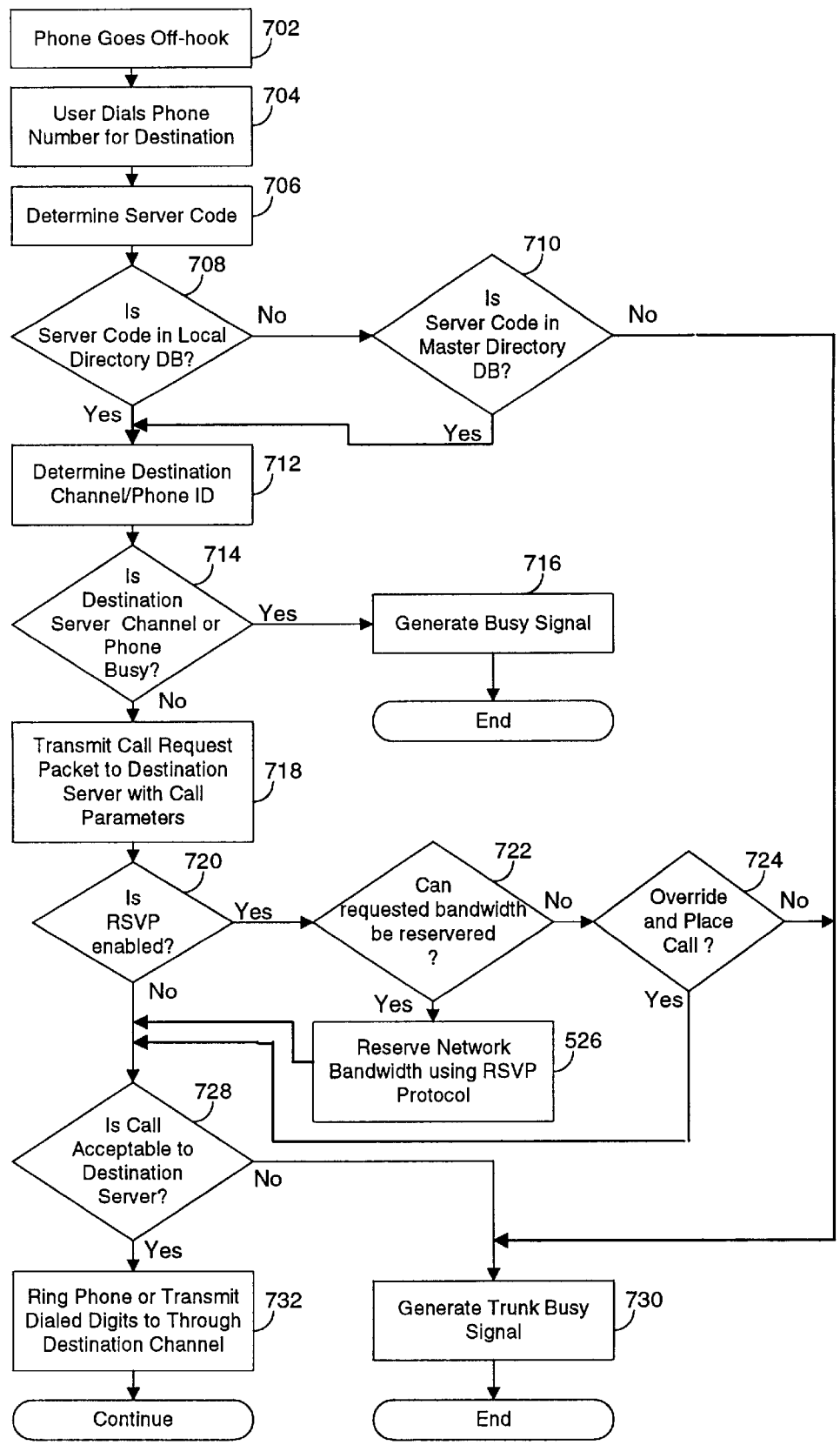
FIG. 7 is a flow chart illustrating a call setup procedure according to the preferred embodiment of the present invention.

FIG. 7 is a flow chart illustrating a call setup procedure according to the preferred embodiment of the present invention. For the example described below, the telephone call setup procedure provides a connection between the PC-phone system 103/105 and the second telephone 142. Phone 105 is connected to computer 103 that is connected to the router 114. A user activates the telephone by, for example, lifting a handset in order to transition 702 to an off-hook state. The first telephone analog interface 508, using conventional procedures, detects the off-hook condition and generates a conventional dial tone that is transmitted to phone system 105. A user, hearing a dial tone, dials a telephone number that identifies the second phone 142.

The user enters 704 a telephone number that uniquely identifies the second telephone using, for example, a computer keypad, a telephone keypad, or a rotary dial on a telephone. Alternatively, the user can initially enter the number associated with the second phone 142 via a computer keyboard and then selects an implement command to transition into an off-hook state. The computer then transmits the signals identifying the second phone 142. In the preferred embodiment, the first set of digits identifies the destination server 122 through which the second telephone 142 is accessed. This set of digits is called the destination phone identifier and includes a server code and dialed digits that designate a specific phone 142. The number of digits in the server code is, generally, predetermined as a configuration parameter. However, in alternate embodiments, the number of digits in the server code can vary depending upon, for example, the destination server 122. In the preferred embodiment, the server code is from 1–16 digits in length and is fixed for the network as a network configuration parameter. The telephone analog interface 508 sequentially receives the digits and the CODEC converts the received analog signal into a digital signal. The PC-phone/fax management unit 610 receives the signals representing the digits and stores a digit representation in the data buffer 314. When the PC-phone/fax management unit 310 receives 706 all digits of the server code, it transmits the server code to the communication management unit (CMU) 402. The CMU 402 then notifies the call setup/tear-down unit 404. The call setup/tear-down unit 404 retrieves the server code from the data buffer 314 and transmits the server code to the directory management unit 408. The directory management unit 408 searches the local directory 406 for a server that is identified with the server code. If no server matches 708 the received server code in the local directory 406, the directory management unit 408 generates a request to a master directory. A directory management unit for the master directory determines 710 if the received server code is identified with any server in the network. As described above, the master directory is more accurate than the local directory 406. If no server is identified with the server code, an error condition exists and the telephone analog interface 508 transmits a trunk busy signal to the phone 105. If the server code is identified in the master directory, the network address of the destination server 122 associated with the server code is transmitted to the directory management unit 408 along with an indication of the number of additional digits that the destination server 122 uses to precisely identify an attached device, e.g., a telephone, a fax, or a modem. The number of additional digits can vary depending upon the number of channels and the number of aural devices the destination server 122 supports and the number of digits required by the PSTN 140 (or the PBX 128, if the destination phone is phone 129, for example). The directory management unit 408 transmits the network address of the destination server and the number of addition digits to the call setup/tear-down unit 404. The call setup/tear-down unit 404 transmits the number of additional digits to the PC-phone/fax management unit 610.

The user continues dialing and the PC-phone/fax management unit 610 stores the digit information in the data buffer 314. After receiving the required number of additional digits or after a period without receiving any additionally dialed digits, e.g., 10 seconds, the PC-phone/fax management unit 610 transmits these digits to the call setup/tear-down unit 404 using the technique described above with respect to transmission of the server code. The call setup/tear-down unit 404 determines 712 the destination channel (or telephone identifier) and transmits a call setup packet to the destination server 122. The destination server 122 receives the setup packet and transmits the setup packet to GU 101B to determine if the channel of GU 101B is connected to PSTN 140 is available. If the GU 101B channel 147A is not available, the destination server 122 receives a signal indicating the unavailability of the channel to access PSTN 140. If the PBX 128 or a PSTN 140 communicates with the destination server 122 digitally, e.g., using a T1 or E1 line then a single connection can be used for many telephones, e.g., up to 24 phones/channel for a T1 link. Therefore, the destination server 122 determines 714 if the second telephone 142 is busy using a conventional detection procedure. An example of a GU 101 operating with a digital telephone line is described below with reference to FIGS. 8A–8B. The call setup/tear-down unit 404 receives the packet and notifies the PC-phone/fax management unit 610 that the second telephone is busy. After receiving this notification, the PC-phone/fax management unit 610 instructs the telephone analog interface 508 to generate and transmit 716 a busy signal to the PC-phone 103/105.

If the GU channel 147A connected to the PSTN 140 is available, the destination server 122 transmits an acknowledgment packet to the PC-phone system 103/105 indicating that it is available. The call setup/tear-down unit 404 in the computer 103 receives the acknowledgment packet and generates and transmits 718 a call request packet to the destination server 122. The call request packet includes an indication as to whether 720 a call priority is to be requested. The preferred embodiment uses the resource reservation protocol (RSVP) to reserve bandwidth across the WAN 104. The operation of the RSVP is known to persons skilled in the relevant art. A description of the RSVP is set forth in R. Braden et al, *Resource Reservation Protocol (RSVP)— Version 1 Functional Specification*, Internet Engineering Task Force (IETF), (Mar. 18, 1996), which is incorporated herein in its entirety. If a call priority signaling protocol is to be used, the call setup/tear-down unit 404 activates the priority management unit 416 to request a reservation of bandwidth across the WAN 104. The priority management unit 416 identifies the amount of bandwidth to be reserved. The destination server 122 receives the call setup packet and reserves the channel for the call. If a call priority is requested, the PC-phone system 103/105 and the destination server 122 implement RSVP to determine 722 if the requested bandwidth can be reserved by reservation requests transmitted to the network. A call acceptance packet is then returned to the PC-phone system 103/105 after the bandwidth reservation attempt. If the requested bandwidth cannot be reserved, the call setup/tear-down unit 404 can connect 724 the call anyway 724, albeit with a lower quality, or a busy signal can be generated 730 using the technique described above. In an alternate embodiment, router priority protocols, e.g., weighted fair queuing (WFQ) or traffic prioritization, can be used to assure priority across the WAN 104.

If the call parameters, e.g., bandwidth reservation success, jitter buffer size, FEC characteristics are acceptable 728 to the PC-phone system 103/105, and the destination server 122, the destination server 122 instructs the channel 1 analog interface 204A in its GU 101B to present the dialed digits received from PC-phone 103/105 to the PSTN over the channel 1 analog interface 204A by generating an off-hook condition on the channel 1 analog interface, receiving a dial tone from PSTN 140, and transmitting digits in sequence over the channel 1 analog interface 204A to establish a connection to phone 142. The audio connection between PC-phone 103/105 and channel 1 of the GU 101B is then established and the user at PC-phone 103/105 will hear the PSTN 140 audio call progress signals, e.g., ring signals, busy signals, trunk busy signal, and will hear the person answering phone 142.

The procedure for setting up a call for fax or modem transmission is similar to setting up a telephone call, as described above, except that the end-to-end delay of the signal is, typically, not as important as it is for voice communication, and therefore, bandwidth across the WAN 104 does not need to be reserved. However, the present invention can reserve bandwidth for fax or modem communications.

Figure 8A:
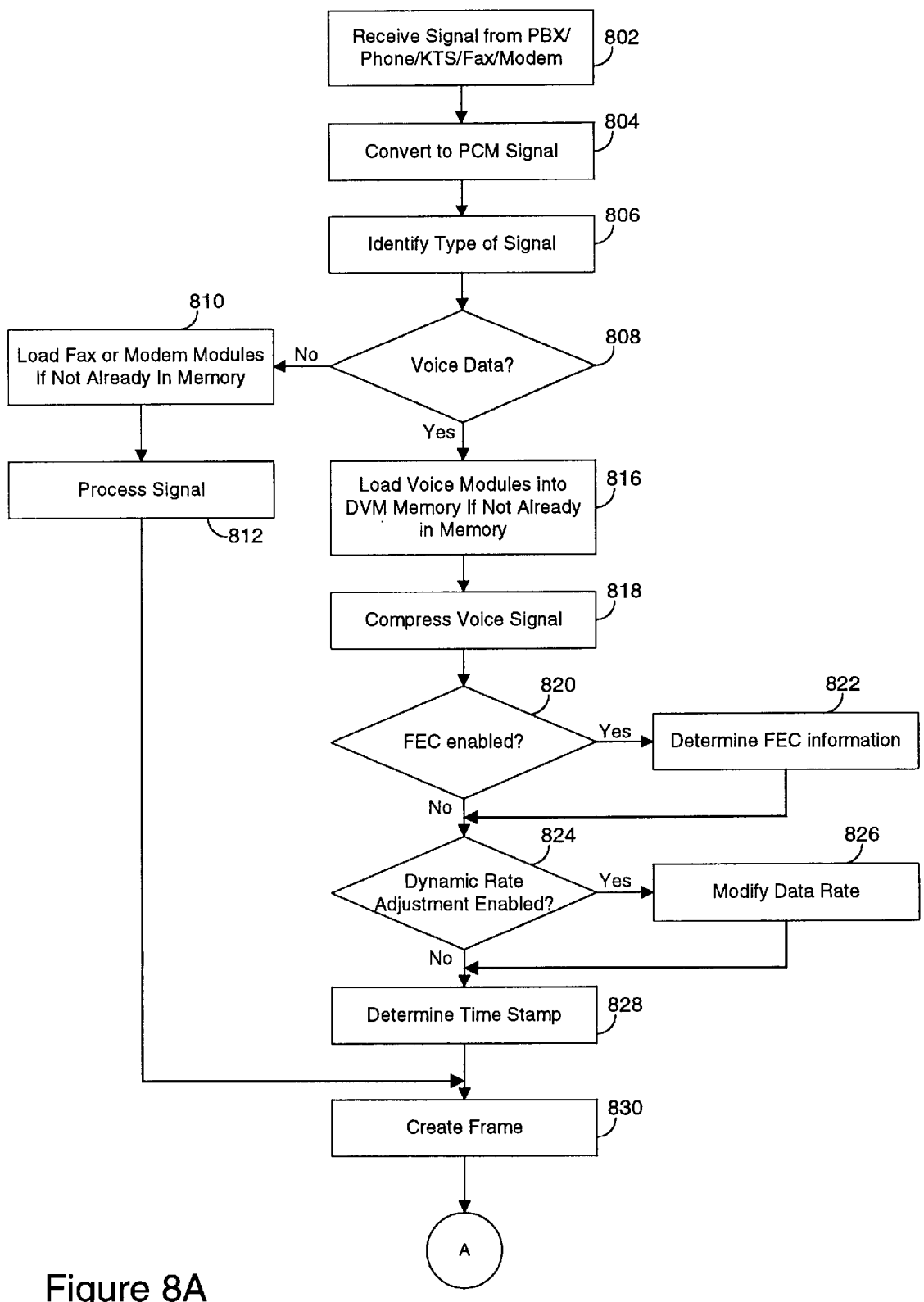
FIGS. 8A and 8B are flow charts illustrating an aural signal transmission procedure according to the preferred embodiment of the present invention.
Figure 8B:
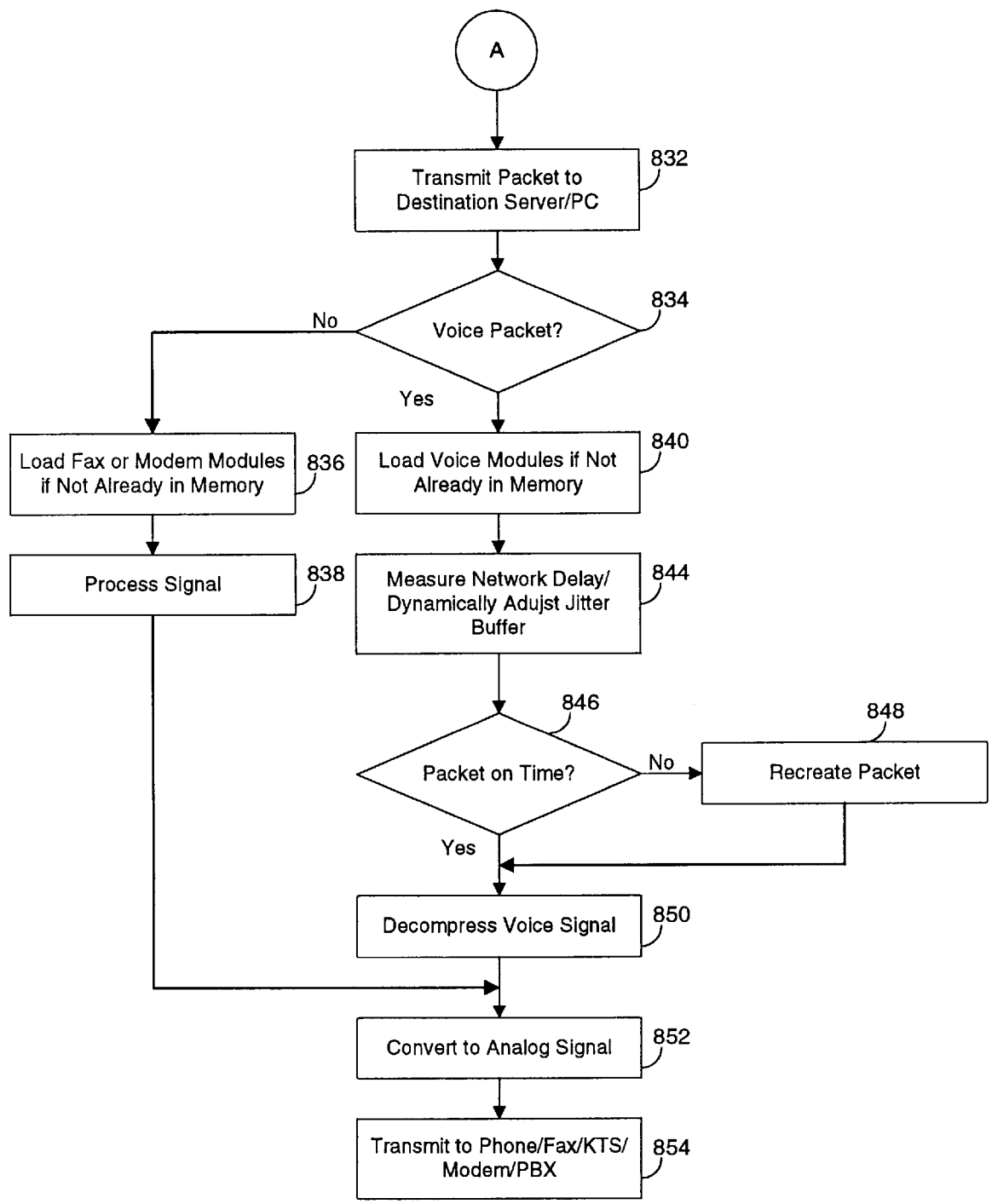

FIGS. 8A and 8B are flow charts illustrating a voice signal transmission procedure according to the preferred embodiment of the present invention. After a connection is setup, aural traffic, e.g., voice, fax, or modem signal, can be transmitted between the PC-phone system 103/105 and the second telephone 142. A user generates aural information that is received 802 by either the channel 1 analog interface 204A in the GU 101B or the telephone analog interface 508 in the computer 103. As described above, the operations performed by the PC-phone system 103/105 are conventional with the exception that the voice enhancement module 620 may be capable of performing a non-conventional FEC procedure that is described in greater detail below.

The functions performed by the GU 101 when receiving aural signals from an aural device, e.g., from the second phone 142, is now set forth. The channel 1 analog interface 204A receives the aural signal from the PSTN 140 and transmits the signal to the CODEC 206A. The CODEC 206A converts 804 the analog signal to a PCM signal, for example, using a standard technique. The PCM signal is transmitted to the DVM 208A. The call ID unit 308 identifies 806 the type of aural signal that is received and determines if the signal is valid and supported, e.g., if it is voice, fax, or modem data, or if the modem rate is supported. The technique for identifying the type of signal is described in U.S. Pat. No. 5,187,591 entitled SYSTEM FOR TRANSMITTING AND RECEIVING AURAL INFORMATION AND MODULATED DATA, to Guy et al., that is incorporated by reference herein in its entirety.

If the aural signal is identified 808 as a fax signal, the call management unit 310 transmits a signal to the communication management unit 402 requesting that copies of the fax program modules be transmitted 810 to the DVM memory 304 from the voice/fax/modem program unit 414 if not already present in the DVM memory 304. The fax program modules includes a fax unit (not shown) and a framer (not shown). The fax unit performs fax signal modulation 812 and demodulation and the framer creates frames of data. Similarly, if the aural signal is identified 808 as a modem signal, the call management unit 310 transmits a signal to the communication management unit 402 requesting that copies of the modem program modules be transmitted 810 to the DVM memory 304 from the voice/fax/modem program unit 414 if not already present in the DVM memory 304. The modem program modules include a modem unit (not shown) and a framer (not shown). The modem unit performs modulation 812 and demodulation on the received modem signals and the framer creates frames of data from the demodulated signal. If the aural signal is identified 808 as a voice signal, the call management unit 310 transmits a signal to the communication management unit 402 requesting that copies of the voice program modules be transmitted 816 to the DVM memory 304 from the voice/fax/modem program unit 414 if not already present in the DVM memory 304. The voice program modules include a voice unit 312, a framer 318, and a voice enhancement unit 320. In addition, portions of memory are set aside as a data buffer 314 and as a jitter buffer 316. The jitter buffer 316 can be used for voice signals, fax signals, and modem signals, for example.

If the signal is a voice signal, the voice unit 312 compresses 818 the PCM signal from a 64 kbps signal to an 8 kbps signal using a conventional compression algorithm, for example. In the preferred embodiment, the compression algorithm is the ITU G.729 compression algorithm and is described in International Telecommunication Union (TCU) Telecommunications Standardization Sector, *Draft Recommendation G.729, Coding of Speech at 8 kbit/s using Conjugate-Structure Alaebraic-Code-Excited Linear-Predictive (CS-ACELP) Coding*, Ver. 6.1 (Jun. 21, 1995), that is incorporated by reference herein in its entirety. Alternatively, the compression algorithm may be GSM, as described in Mouly and Pautet, The GSM System for Mobile Communications, Palaiseau, France, G.723, as described in International Telecommunication Union (ITU) ITU-T Draft G.723, Dual Rate Speech Coder for Multimedia Communications Transmitting at 5.3 & 6.3 KBIT/S, Oct. 17, 1995, which are both incorporated by reference herein in their entirety, or a proprietary algorithm.

A forward error correction (FEC) function can be enabled automatically, if a predetermined percentage of packets are not being received by the second server 122 in a timely manner, or enabled manually either by the server 112 or remotely, using the SNMP network management unit 418. Typically, the FEC function is enabled only if it is supported at both ends of the connection, e.g., by both the GU 101 and the voice enhancement unit 620 of the PC-phone system 103/105. If enabled 820, the FEC function is performed by the voice enhancement unit 320. Performing FEC enables the destination server 122 to recreate packets of data that are lost in transmission or are not received by the second server by a particular time. In the preferred embodiment, the framer 318 generates a frame that includes approximately 20 ms of voice information. After generating the frame, the frame is transmitted to and stored in the server memory module 214. After receiving two frames, the network packetizer 410 creates a packet that includes approximately 40 ms of voice information, e.g., two 20 ms frames. The FEC information is included in the packet.

Figure 9:
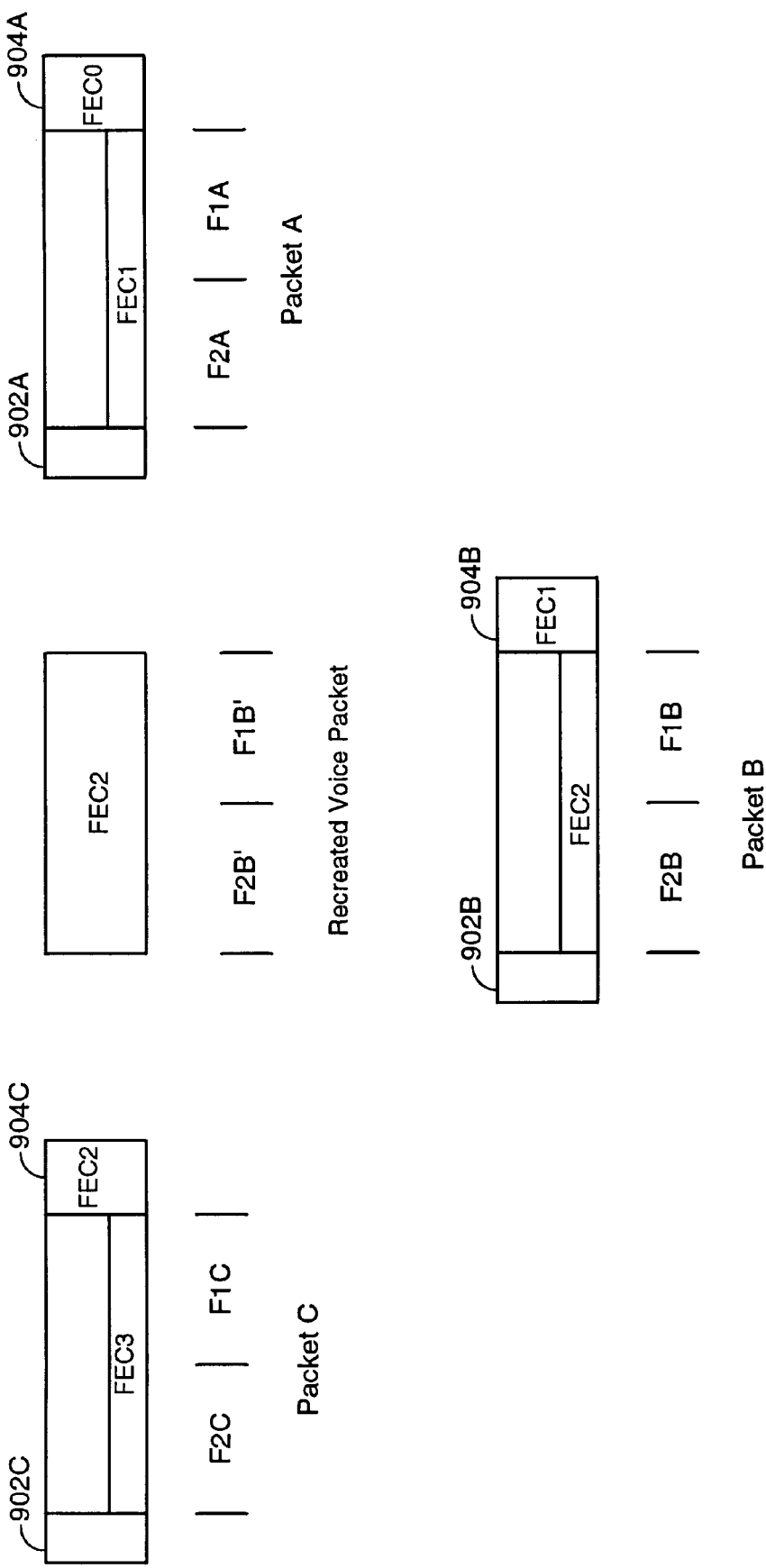
FIG. 9 is an example of the forward error correction (FEC) process illustrating three voice packets, packet A, packet B, and packet C.

FIG. 9 is an example of the forward error correction (FEC) process illustrating three voice packets, packet A, packet B, and packet C. Each packet includes a packet header 902, two frames of voice data, F1 and F2, and FEC information 904. In the preferred embodiment, the FEC information 904 includes 822 reduced-quality voice data from the previous packet, e.g., approximately 25–50 percent of the data from the previous packet. For example, for Packet C in FIG. 9, the FEC information is in correction block FEC3 and includes partial information from the data portion of the previously transmitted packet, i.e., Packet B. This partial information is, generally, the frame-to-frame predictive information and pitch value for the first sub-frame of a G.729 implementation. A goal of the present invention is to enable aural information to be transmitted across a LAN 116, a WAN 104, and another LAN 134 transparently as an overlay on the existing IP capabilities of the LANs 116, 134 and WAN 104. This technique is also known as "Voice-over-IP". The quality of present invention approaches, equals, or exceeds the quality of the public telephone systems when a priority transmission protocol is used. For example, in general, a user can detect a 40 ms gap in a conversation. That is, the loss of a single packet can be detected by the user. However, a 40 ms gap that is reconstructed from a reduced set of parameters of the missing signal is generally not detectable by the user. Accordingly, to increase voice quality, the present invention stores a reduced-quality version consisting of partial voice data from the previous packet as FEC information 904. If packet B is lost, packet B can be recreated by using the FEC information 904C in packet C to produce F1B' and F2B' signals similar to the lost F1B and F2B signals. As stated above, in the preferred embodiment, the frame-to-frame predictive information and pitch parameters of a G.729 implementation provides the partial data for forward error correction. FIG. 9 illustrates one technique for recreating a lost packet, e.g., Packet B. Using the FEC results in a slightly reduced quality signal to replace lost packet B. The loss of quality of the resulting signal is generally not detectable by the user for packet losses up to approximately ten percent. It will be apparent to persons skilled in the relevant art that other implementations of correction information can be used.

In heavy traffic conditions, the WAN 104 may be unable to provide the requested bandwidth. In this situation, for example, the present invention can, optionally, dynamically adjust the rate of data transmission with only a minor decrease in the voice quality. If enabled 824 the voice enhancement unit 320 reduces 826 the bit rate from approximately 8 kbps to approximately 6.4 kbps by eliminating twenty percent of voice data for each frame. For example, if each 20 ms frame includes 10 bytes of data, the last 2 bytes of data, or two non-consecutive bytes of data, are not included in the frame. The resulting frame has a size of 8 bytes and, accordingly, the bit rate is reduced 20 percent since only each frame is 20 percent smaller. Similarly, the voice enhancement unit 320 can reduce the bit rate by forty percent, to 4.8 kbps by not including forty percent of the voice data for each frame.

For every second frame, the call management unit 310 generates 828 a time stamp representing time as a counter which represents the number of voice samples processed. The time stamp is used to determine when a the subsequently transmitted packet is late, as described below. In an alternate embodiment, the time stamp can be provided by the server 112 as it forms the frames into packets.

The framer 318 creates 830 a frame that includes approximately 20 ms of voice data. In addition, every second frame of voice data is associated with time stamp information and, if enabled, the framer generates a FEC frame that includes a reduced quality representation of data from frames transmitted in the previous packet.

The frames are received by the network packetizer 410 that compiles two frames, the time stamp information, and, if enabled, FEC information. The network packetizer then adds a packet header 902 that includes the network address of the second telephone 142. For example, the network address of the second telephone 142 can include the network address of the destination server 122 and information identifying the GU 101 channel or PBX 128 channel of the second telephone 142. The communication management unit 402 then transmits 832 the packet through the NIC 218 to the router 132 of the second LAN 134. The router 132 transmits the packet through the WAN 104 and the packet is received by the router 114 of the first LAN 116. The router 114 transmits the packet to the PC-phone system 103/105.

The functions performed by the GU 101B when receiving a signal from the PC-phone system 103/105 is now set forth. After receiving a packet, the network packetizer 410 removes the packet header and transmits the packet to the DVM 208. If the packet contains 836 fax data, the call management unit 310 instructs the communication management unit 402 to load 836 the fax program modules into the DVM memory 304, if the modules are not already present, using the technique described above. The fax unit then processes 838 the signal. If the packet contains 836 modem data, the call management unit 310 instructs the communication management unit 402 to load 836 the modem program modules into the DVM memory 304, if the modules are not already present, using the technique described above. The modem unit then processes the signal. Similarly, if the packet contains 836 voice data, the call management unit 310 instructs the communication management unit 402 to load 840 the voice program modules into the DVM memory 304, if the modules are not already present, using the technique described above. In an alternate embodiment the DVM memory 304 is large enough to store all of the voice, fax, and modem program modules and, therefore, these program modules are only transmitted to the DVM memory 304 once.

The voice enhancement unit 320 then dynamically determines 844 the end-to-end network delay. This variation in the delay can be used to modify the size of the jitter buffer 316, and the overflow jitter buffer 424. The size of the jitter buffer 316 and the overflow jitter buffer 424 are directly proportional to the expected variation in the network delay. Specifically, the jitter buffer 316 buffers frames that are received by the DVM 208. In an ideal network the network delay is constant. Therefore, when the DVM 208 receives a voice frame, the DVM 208 can decompress the voice frame and immediately transmit it to the second telephone 142. However, if a packet is delayed, then the resulting transmission of the aural signal to the second telephone 142 is also delayed. Such a delay is undesirable because of the resulting poor aural signal quality. Accordingly, the present invention utilizes a jitter buffer 316 to allow for fluctuations in the receipt of packets. In the preferred embodiment, the jitter buffer 316 is a first-in-first-out buffer that stores voice frames and has a size that is set in response to network end-to-end characteristics, e.g., network delay, that can be determined during the call set-up procedure. In an alternate embodiment, the jitter buffer 316 can also be adjusted dynamically during the call or can be sent by a user as a configuration protocol, for example. If the jitter buffer 316 is too small, then a network delay variation can result in an aural transmission gap at the second telephone 142. However, increasing the jitter buffer 316 also increases the end-to-end network delay since the jitter buffer 316 stores the voice frames for a time duration that is proportional to the size of the jitter buffer 316. The present invention adjusts the jitter buffer 316 by measuring 844 the network delay for each call and modifying the size of the jitter buffer 316 to reflect the network characteristics for that call.

If a packet is late 846, e.g., if the jitter buffer contents up to the packet have been used, then the voice enhancement unit 320 recreates 848 the late packet using the FEC information in the next packet. If the packet then arrives late, it is discarded, or if not all two frames of the packet have been recreated and transmitted to the second telephone 142, the actual data can be substituted for the reduced quality FEC data for the remaining frames in the packet. The technique for recreating the packet is described above.

The voice unit 312 then decompresses 850 the voice frame using the G.729 decompression algorithm. The decompressed signal is transmitted to the CODEC 206 which converts 852 the decompressed signal to an analog signal. The CODEC 206 transmits the signal to the channel 1 analog interface 204 that transmits the signal to the PSTN 140, as described above. The PSTN 140 then transmits 854 the aural signal to the second telephone 142. The user of the second telephone 142 receives the aural signals through a speaker in a telephone handset, for example.

In the present invention, a call can be terminated by a user of either the PC-phone 105 or the second phone 142, for example. When a user terminates a telephone call the call management unit 310 or the PC-phone/fax management unit 610 detects this condition, performs a conventional teardown procedure, and notifies the call management unit 402 which instructs the priority management unit 416 to release the reserved bandwidth.

The present invention typically provides an end-to-end network delay, with the FEC procedure enabled, of less than 200 ms. The present invention also has the ability to dynamically adjust the jitter buffer size and to recreate delayed or lost voice frames. The result is a system and method that provides an aural signal transmission quality that is close to or exceeds the transmission quality of conventional public switched networks.

In addition, the present invention has the ability to use an overflow jitter buffer to operate using networks, e.g., the Internet, having end-to-end delay up to several seconds when not utilizing a transmission priority technique, e.g., RSVP, and provides a recognizable voice signal that is generally of a lower quality. The present invention enables a user from any telephone, e.g., a PC-phone system 103/105, to call any other telephone without using traditional long distance telephone networks while enabling access to local PSTNs or PBXs, for example, in order to provide access to a large number of aural devices.

Figure 10:
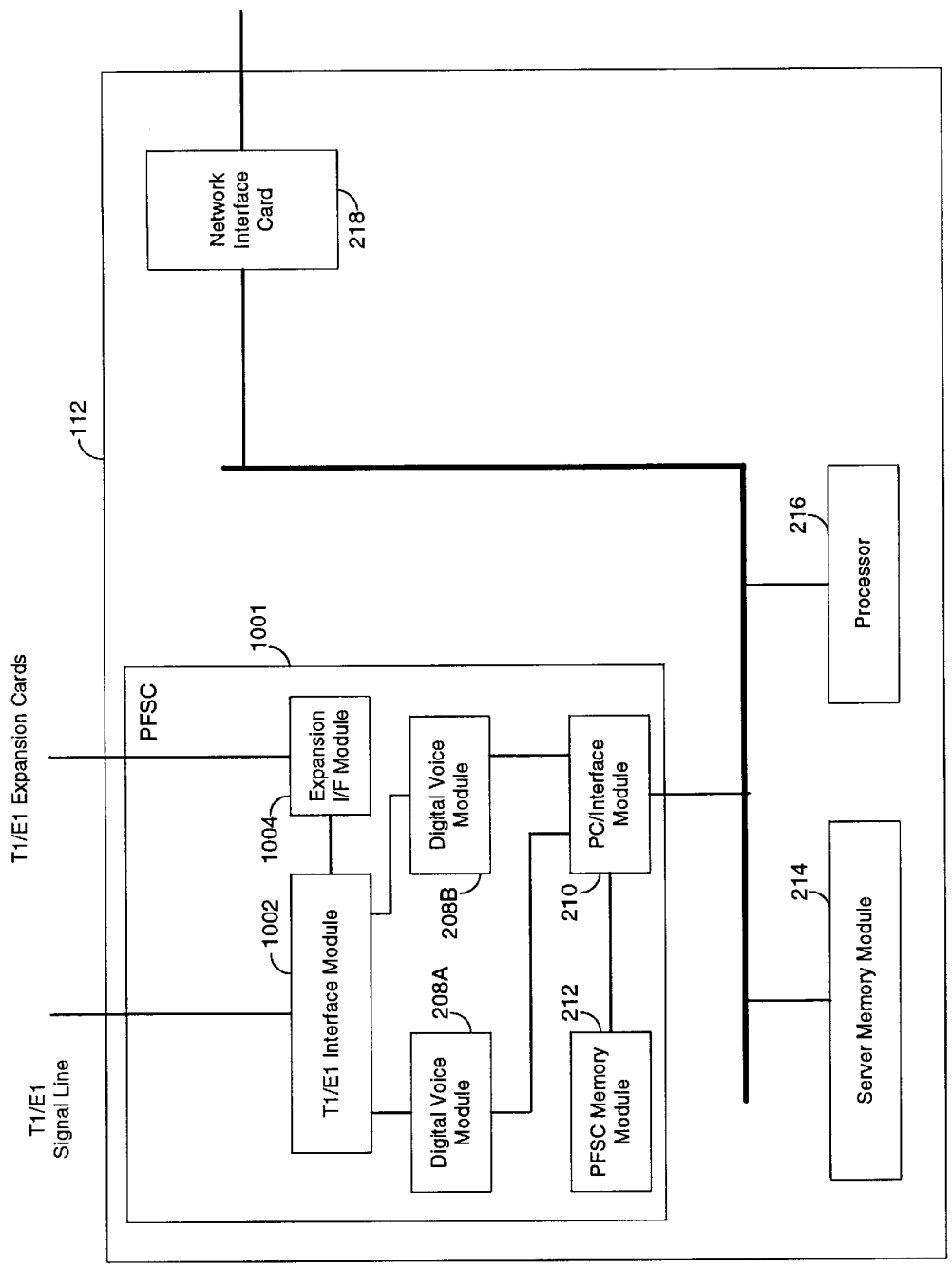
FIG. 10 is a more detailed illustration of a PC/file server and a gateway unit having a digital telephony interface according to an alternate embodiment of the present invention.

FIG. 10 is a more detailed illustration of a file server 112 and a gateway unit 1001 having a digital telephony interface according to the preferred embodiment of the present invention. The server includes a NIC 218, a processor 216, and a server memory module 214, that are described in detail above. The digital GU 1001 includes two DVMs 208, a PC/interface module 210 and a GU memory module 212, that are described above. The digital GU 1001 includes a T1/E1 interface module that receives digitized aural signals on a T1/E1 signal line. The T1/E1 interface module 1002 multiplexes the signal from up to twenty-four DVMs 208 on a single T1 line or up to thirty DVMs 208 on a single E1 line. One embodiment of the present invention includes four DVMs on the T1/E1 interface card 1001 and connects through expansion interface module 1004 to T1/E1 channel expansion cards, each having an additional four DVMs. The T1/E1 interface module 1002 provide higher density connection capabilities for the phone/fax server implementation.

While the present invention has been particularly shown and described with reference to a preferred embodiment, and several alternate embodiments, it will be understood by persons skilled in the relevant art that various changes in form and details can be made therein without departing from the spirit and scope of the invention.

What is claimed is:

1. A method for transmitting aural signals across a wide area digital data network and a target phone system, comprising the steps of:
   receiving a first aural signal having a first configuration, said first aural signal representing a voice signal;
   converting said first aural signal into a first data signal having a first network configuration that can be transmitted through a first local area network including the steps of:
      converting said first aural signal to a digital signal;
      generating first and second data transmission unit signals, having said first network configuration, from said digital signal, said first data transmission unit signal includes:
         a first voice unit signal; and
         a correction unit signal including a representation of a second voice unit signal from a second data transmission unit signal, transmitted separately from a first data transmission unit signal, said correction unit signal for recreating said second data transmission unit signal if not received by said destination converter;
      wherein said first data signal represents said first data transmission unit signal;
   transmitting said first data signal to a first communication device through said first local area network;
   transmitting said first data signal from said first communication device to a second communication device in a second local area network through the wide area digital data network;
   transmitting said first data signal to a destination converter through said second local area network;
   converting said first data signal to a second data signal that is compatible with the target phone system; and
   transmitting said second data signal from said destination converter to a first receiver via the target phone system;
   wherein said steps of receiving a first aural signal and converting said first aural signal are performed by a PC-phone.

2. The method of claim 1, wherein said first data signal represents one of a first signal and a call control signal, said first signal in the form of one of a digitized voice signal, a demodulated modem signal, and a demodulated facsimile signal.

3. The method of claim 2, wherein said call control signal represents one of call setup information, call teardown information, call priority information, and call status information.

4. The method of claim 1, further comprising the step of converting said second data signal to a second aural signal wherein said second aural signal is one of a near toll quality representation of said first aural signal and a toll-quality representation of said first aural signal.

5. The method of claim 1, wherein said step of converting said first aural signal to a digital signal includes the steps of:
   converting said first aural signal to a first converted digital signal using a pulse code modulation algorithm; and
   compressing said first converted signal using a compression algorithm to generate said digital signal.

6. The method of claim 5, wherein said compression algorithm is an ITU standard compression algorithm of Jun. 21, 1995.

7. The method of claim 1, further comprising the step of:
   identifying said correction unit signal in said first data transmission unit signal after receiving said first data signal; and
   utilizing said correction unit signal to generate a recreated second voice unit signal of said second data transmission unit signal, wherein said recreated second voice unit signal is of a lower quality than said second data transmission unit signal when said correction unit signal includes less data than a voice unit signal of said second data transmission unit signal.

8. The method of claim 1, wherein said first data transmission unit signal represents a voice signal having a first duration.

9. The method of claim 8, further comprising the step of:
   dynamically reducing the time required for transmitting data through said wide area digital data network by reducing the amount of information in said first data transmission unit signal without reducing said first duration.

10. The method of claim 1, further comprising the steps of:
    measuring a first delay representing the time period between transmitting said first data signal to said first communication device and receiving said first data signal at said destination converter;
    dynamically adjusting a buffer based upon the variation in said first delay and an expected delay of the network.

11. The method of claim 1, further comprising the step of:
    establishing priority for said first data signal across one of said wide area digital data network and leased lines.

12. The method of claim 1, wherein said first communication device is one of a network router and a network switch.

13. The method of claim 1, further comprising the step of:
    establishing priority for said first data signal across said wide area digital data network using a priority protocol.

14. The method of claim 13, wherein said priority protocol is the resource reservation protocol.

15. A system for transmitting aural signals across a local area network, a wide area digital data network, and a target phone system, comprising:
    a PC phone including
       a first aural receiver for receiving a first aural signal having a first configuration, said first aural signal representing a voice signal; and
    a first converter, disposed to receive signals from said first aural receiver, for converting said first aural signal into a first data signal having a first network configuration that can be transmitted through a first local area network including:
       a second converter for converting said first aural signal to a digital signal; and
       a transmission unit generator, disposed to receive said digital signal, for generating first and second data transmission unit signals, having said first network configuration, from said digital signal, said first data transmission unit signal including a first voice unit signal and a first correction unit signal including a representation of a second voice unit signal from a second data transmission unit signal, transmitted separately from said first data transmission unit signal, said correction unit signal for recreating said second voice unit signal if not received by said destination converter, wherein first data signal represents a first data transmission unit signal;

a first local network transmitter, disposed to receive signals from said first converter, for transmitting said first data signal onto said first local area network;

first and second communication devices, said first communication device disposed to receive signals from said first local network transmitter, for transmitting said first data signal to said second communication device in a second local area network through the wide area digital data network, said second communication device for transmitting said first data signal through said second local area network; and said destination converter, disposed to receive signals from said second communication device, for converting said first data signal to a second data signal that is compatible with the target phone system and for transmitting said second data signal through the target phone system to a first receiver.

16. The system of claim 15, wherein said first data signal represents one of a first signal and a call control signal, said first signal is in the form of one of a digitized voice signal, a demodulated modem signal, and a demodulated facsimile signal.

17. The system of claim 16, wherein said call control signal represents one of call setup information, call teardown information, call priority information, and call status information.

18. The system of claim 15, further comprising a:
a second converter, disposed to receive signals from said destination converter, for converting said second data signal to a second aural signal wherein said second data signal is one of a near toll quality representation of said first aural signal and a toll-quality representation of said first aural signal.

19. The system of claim 15, wherein said second converter converts said first aural signal to a first converted digital signal using a pulse code modulation algorithm and compresses said first converted signal using a compression algorithm to generate said digital signal.

20. The system of claim 19, wherein said compression algorithm is an ITU standard compression algorithm.

21. The system of claim 15, wherein said destination converter includes a correction unit, for identifying said correction unit signal in said first data transmission unit signal after receiving said first data signal and for utilizing said correction unit signal to generate a recreated second voice unit signal of the data transmission unit signal, wherein said recreated second voice unit signal is of a lower quality than said second data transmission unit signal when said correction unit signal includes less data than a voice unit signal of said second data transmission unit signal.

22. The system of claim 15, wherein said first data transmission unit signal represents a voice signal having a first duration.

23. The system of claim 15, further comprising a priority management unit, disposed to receive signals from said first converter, for establishing priority for said first data signal across one of said wide area digital data network and leased lines.

24. The system of claim 15, wherein said first communication device is one of a network router and a network switch.

25. The system of claim 15, further comprising a priority management unit, disposed to receive signals from said first converter, for establishing priority for said first data signal across one of said wide area digital data network and leased lines using a priority protocol.

26. The system of claim 25, wherein said priority protocol is the resource reservation protocol.

27. A system for communications, comprising:
a conversion unit, disposed to receive an aural signal, including:
a converter for converting said aural signal to a digital signal; and
a transmission unit generator, disposed to receive said digital signal, for generating a plurality of data transmission unit signals from said digital signal, each of said data transmission unit signals capable of being transmitted via a network and including an aural unit signal and a correction unit signal, said correction unit signal including a representation of the aural unit signal from another of said data transmission unit signals, said correction unit signal for recreating the aural unit signal of said another data transmission unit signal, if not received by a destination converter.

28. The system of claim 27, wherein said aural signal is received from a PC-phone.

29. The system of claim 28, further comprising:
a correction unit, disposed to receive said data transmission unit signals, to identify when a first of said data transmission unit signals has not been received and to identify the correction unit signal in a second of said data transmission unit signals representing the aural unit signal in said first data transmission unit signal, to generate a recreated aural unit signal of said first data transmission unit signal, wherein said recreated second aural unit signal includes less data than the aural unit signal of said first data transmission unit signal.

30. The system of claim 27, further comprising:
a correction unit, disposed to receive said data transmission unit signals, to identify when a first of said data transmission unit signals has not been received and to identify the correction unit signal in a second of said data transmission unit signals representing the aural unit signal in said first data transmission unit signal, to generate a recreated aural unit signal of said first data transmission unit signal, wherein said recreated second aural unit signal includes less data than the aural unit signal of said first data transmission unit signal.

31. The system of claim 30, wherein said system transmits a plurality of data transmission unit signals having one of a near toll-quality and toll-quality.

32. The system of claim 30, further comprising:
a jitter buffer for storing received data transmission unit signals.

33. The system of claim 32, wherein a length of said jitter buffer is variable.

34. The system of claim 33, wherein said length of said jitter buffer is dependent upon a data delay variation.

35. The system of claim 34, wherein said jitter buffer is dynamically adjusted based upon said data delay variation.

36. The system of claim 30, further comprising:
a first network transmitter, disposed to receive signals from said conversion unit, for transmitting said data transmission unit signals to said network.

37. The system of claim 30, wherein said data transmission unit signals are in the form of packet data.

38. The system of claim 30, wherein said conversion unit receives data transmission unit signals and converts said data transmission unit signals into another aural signal.

39. The system of claim 27 wherein said aural signal includes a voice signal.

40. The system of claim 27, wherein said correction unit signal includes less data than the aural unit signal of said another data transmission unit signal.

41. A communications method, comprising the steps of:

receiving an aural signal;

converting said aural signal into a digital signal; and generating a plurality of data transmission unit signals from said digital signal, each of said data transmission unit signals capable of being transmitted via a network and including an aural unit signal and a correction unit signal, said correction unit signal including a representation of said aural unit signal from another of said transmission unit signals, said correction unit signal for recreating said aural unit signal of said another data transmission unit signal, if not received by a destination converter.

42. The method of claim 41, wherein said aural signal is received from a PC-phone.

43. The method of claim 42, further comprising the steps of:

receiving data transmission unit signals;

identifying that a first of said data transmission unit signals has not been received;

identifying a correction unit representing the aural unit signal in said first data transmission unit signal; and generating a recreated aural unit signal, representing said aural unit signal in said first data transmission unit signal using said identified correction unit, wherein said recreated aural unit signal includes less data than said aural unit signal of said first data transmission unit signal.

44. The method of claim 41, further comprising the steps of:

receiving data transmission unit signals;

identifying that a first of said data transmission unit signals has not been received;

identifying a correction unit representing the aural unit signal in said first data transmission unit signal; and generating a recreated aural unit signal, representing said aural unit signal in said first data transmission unit signal using said identified correction unit, wherein said recreated aural unit signal includes less data than said aural unit signal of said first data transmission unit signal.

45. The method of claim 44, further comprising the step of transmitting a plurality of data transmission unit signals having one of a near toll-quality and toll-quality.

46. The method of claim 44, further comprising the step of:

using a jitter buffer to store received data transmission unit signals.

47. The method of claim 46, wherein a length of said jitter buffer is variable.

48. The method of claim 47, further comprising the step of:

varying said length of said jitter buffer based upon a data delay variation.

49. The method of claim 48, wherein said varying step includes the step of:

dynamically adjusting said length of said jitter buffer based upon said data delay variation.

50. The method of claim 44, further comprising the step of:

transmitting said data transmission unit signals onto said data network.

51. The method of claim 41 wherein said aural signal includes a voice signal.

52. The method of claim 41, wherein said correction unit signal includes less data than the aural unit signal of said another data transmission unit signal.

* * * * *